United States Patent
Uno

(10) Patent No.: US 8,432,839 B2
(45) Date of Patent: Apr. 30, 2013

(54) BIDIRECTIONAL WIRELESS COMMUNICATION SYSTEM, WIRELESS COMMUNICATION APPARATUS, AND BIDIRECTIONAL WIRELESS COMMUNICATION METHOD

(75) Inventor: Masahiro Uno, Tokyo (JP)

(73) Assignee: Sony Corporation, Tokyo (JP)

( * ) Notice: Subject to any disclaimer, the term of this patent is extended or adjusted under 35 U.S.C. 154(b) by 435 days.

(21) Appl. No.: 12/923,238

(22) Filed: Sep. 10, 2010

(65) Prior Publication Data

US 2011/0075595 A1 Mar. 31, 2011

(30) Foreign Application Priority Data

Sep. 30, 2009 (JP) .................................. 2009-228003

(51) Int. Cl.
*H04J 1/00* (2006.01)

(52) U.S. Cl.
USPC ............................. 370/281; 370/252; 375/356

(58) Field of Classification Search ................... 370/229, 370/230, 235, 295, 310, 324, 329, 431, 503; 398/183, 161, 154, 155, 156, 140; 455/73, 455/75, 76, 219, 260, 112, 41.2, 39, 344; 375/135, 136, 220, 219, 344, 356, 354, 358
See application file for complete search history.

(56) References Cited

U.S. PATENT DOCUMENTS

| | | | |
|---|---|---|---|
| 2002/0054627 A1* | 5/2002 | Asikainen | 375/219 |
| 2004/0264977 A1* | 12/2004 | Yap et al. | 398/161 |
| 2005/0090208 A1* | 4/2005 | Liao | 455/112 |
| 2009/0088113 A1* | 4/2009 | Marsili et al. | 455/260 |

FOREIGN PATENT DOCUMENTS

| | | |
|---|---|---|
| JP | 2007-158851 | 6/2007 |
| JP | 2007-228499 | 9/2007 |

* cited by examiner

*Primary Examiner* — Abdullah Riyami
(74) *Attorney, Agent, or Firm* — Rader, Fishman & Grauer PLLC

(57) ABSTRACT

A bidirectional wireless communication system includes: a first wireless communication apparatus for bidirectional communication configured to multiplex a modulated signal obtained by modulating an input signal by a reference carrier signal having a predetermined carrier frequency, and transmit a resultant transmission signal; and a second wireless communication apparatus, having an oscillator configured to oscillate a signal having a free-running oscillation frequency, configured to inject a reception signal received from the first wireless communication apparatus into the oscillator, receive the reception signal while variably controlling the free-running oscillation frequency of the oscillator of the second wireless communication apparatus, detect whether the free-running oscillation frequency of the signal of the oscillator of the second wireless communication apparatus has entered the frequency range up to the injection locking to be frequency-locked with a carrier frequency of the injected reception signal, and generate a communication enable signal.

16 Claims, 10 Drawing Sheets

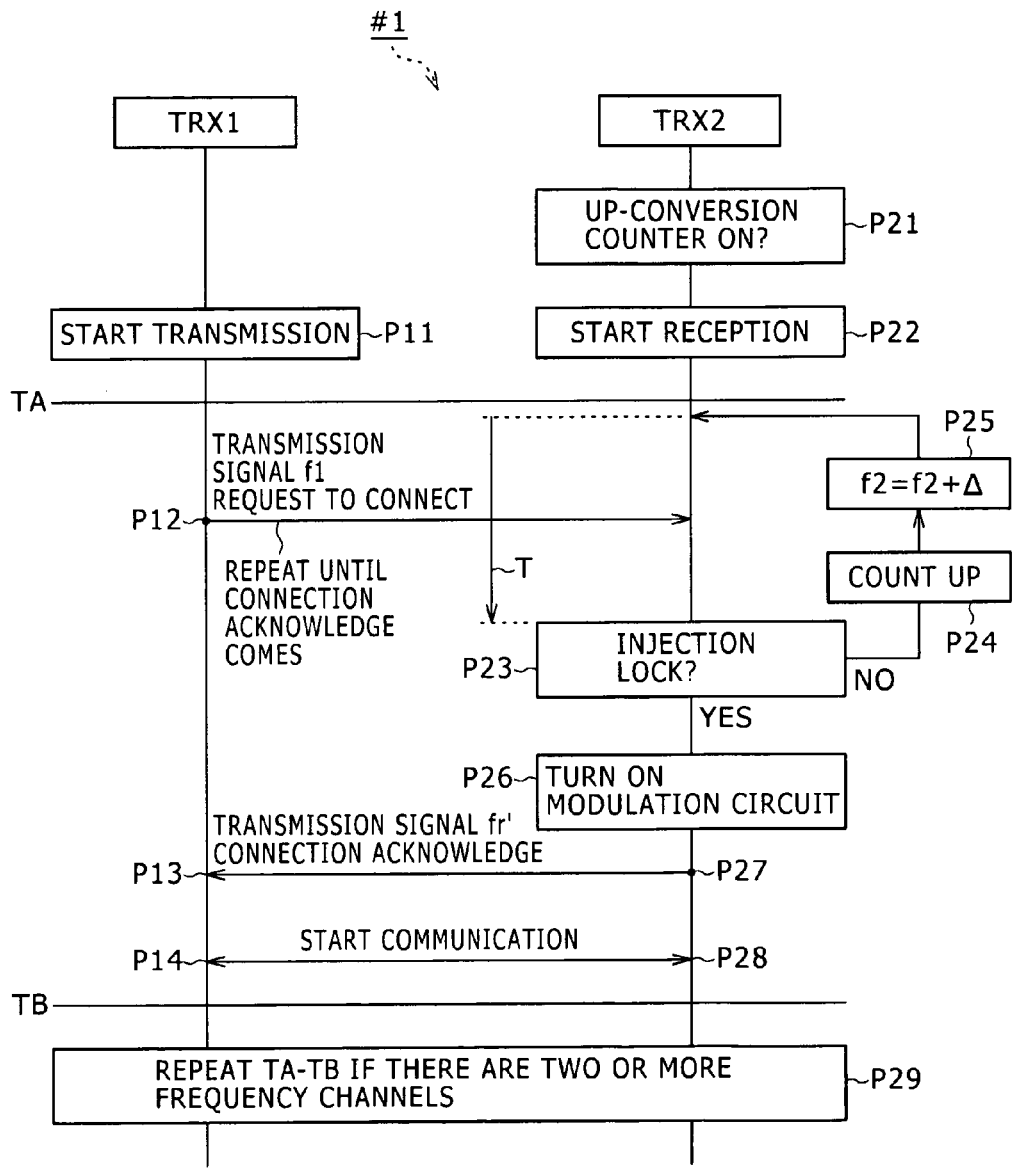

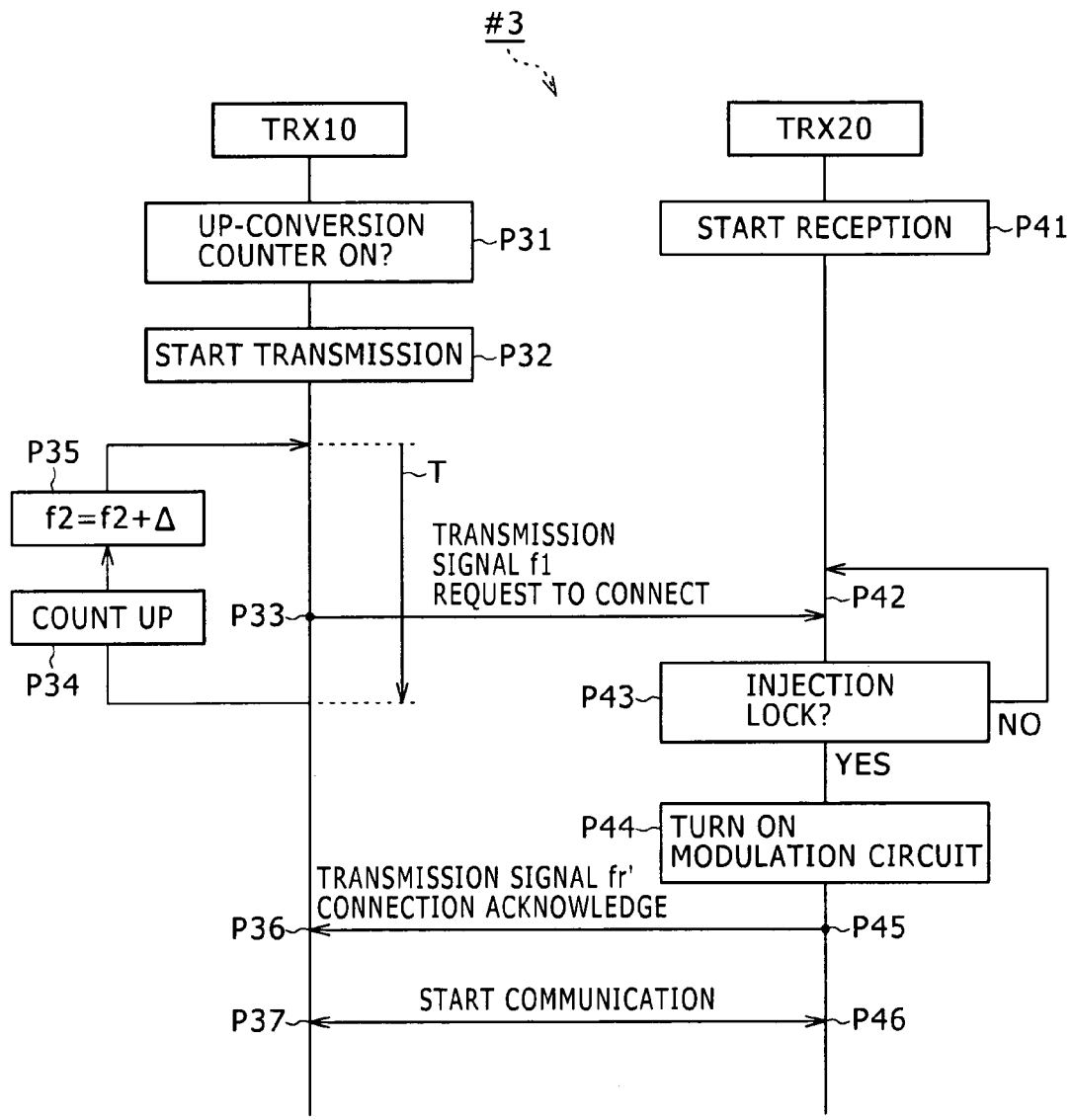

BIDIRECTIONAL WIRELESS COMMUNICATION SYSTEM, WIRELESS COMMUNICATION APPARATUS, AND BIDIRECTIONAL WIRELESS COMMUNICATION METHOD

BACKGROUND OF THE INVENTION

1. Field of the Invention

The present invention relates to a bidirectional wireless communication system, a wireless communication apparatus, and a bidirectional wireless communication method. To be more particular, the present invention is applicable to a bidirectional wireless data transmission system that uses different carrier frequencies for transmission and reception in fast transmitting signals with carrier frequencies being in a millimeter band of 30 GHz to 300 GHz for carrying movie images and computer graphics, for example, between devices arranged relatively closely to each other or inside a device.

2. Description of the Related Art

With the recent enormous increase in the amount of information, such as movie images and computer graphics, demands have been increasing for systems capable of handling high-speed and large-capacity digital communication regardless of wired or wireless. Wireless data transmission systems based on millimeter waves have features for implementing high-speed data transmission. With these high-speed and mass-capacity wireless data transmission systems, the millimeter band has been attracting attention as a frequency band of carrier signals to be used. Accordingly, more and more wireless communication apparatuses for transmitting modulated signals of the millimeter band at high speeds have come to use.

Especially, use of a wireless communication apparatus, such as one mentioned above, for the communication inside a device (the communication between chips, between boards, or between modules inside a device, for example) eliminates the necessity for conductor-based transmission paths. Besides, the use of this wireless communication apparatus enhances the degree of freedom in the arrangement of boards for example, thereby lowering the mounting cost and overcoming EMI (Electro-Magnetic Interference) problems that are conspicuous in LVDS (Low Voltage Differential Signaling).

An attempt to build a bidirectional wireless communication system based on the two wireless communication apparatuses as described above demands a device realized in low power dissipation in the millimeter band, low cost, and small size. Especially, a frequency locking method in an RF (radio frequency) circuit is an important factor in any wireless data transmission system and the circuit scale of such a method heavily depends on how this method is implemented.

For example, according to bidirectional wireless communication systems widely used in the third-generation digital cellular system, wireless communication apparatuses each having a transceiver configuration having a transmitter block and a receiver block both based on frequency synthesizing are used.

Referring to FIG. 10, there is shown a block diagram illustrating an exemplary configuration of a related-art bidirectional wireless data transmission system No. 4. The system No. 4 is made up of two wireless communication apparatuses (hereafter referred to as TRX 40 and TRX 50) each using a frequency synthesizer.

The TRX 40 is configured by a reference oscillator 15, a PLL (Phase Locked Loop) circuit 16, a local oscillation circuit 17, a transmission section 18, a reception section 19, a transmission antenna 106, and a reception antenna 107. The reference oscillator 15 oscillates a signal having a reference oscillation frequency (hereafter referred to as a reference oscillation signal) to supply the generated oscillation signal to the PLL circuit 16.

The reference oscillator 15 is connected with the PLL circuit 16. The PLL circuit 16 has a frequency synthesizer function and generates an oscillation signal having two or more frequencies on the basis of the reference oscillation signal. The PLL circuit 16 is connected with the local oscillation circuit 17. On the basis of the oscillation signal having two or more frequencies, the local oscillation circuit 17 generates a carrier signal having two or more local oscillation frequencies.

The local oscillation circuit 17 is connected with the transmission section 18 and the reception section 19. The transmission section 18 is made up of a modulation block 101, a baseband amplifier 102, an up-conversion mixer 103, and a power amplifier 105. The modulation block 101 modulates entered data DIN1 into a modulated signal SIN1 and outputs the modulated signal SIN1 to the baseband amplifier 102. The modulation block 101 is connected with the baseband amplifier 102. The baseband amplifier 102 amplifies the supplied modulated signal SIN1. The baseband amplifier 102 is connected with the up-conversion mixer 103.

The up-conversion mixer 103 is connected with the local oscillation circuit 17. On the basis of the carrier signal output from the local oscillation circuit 17, the up-conversion mixer 103 up-converts the amplified modulated signal SIN1 and outputs the resultant signal Sout1 to the power amplifier 105. The up-conversion mixer 103 is connected with the power amplifier 105. The power amplifier 105 amplifies the transmission signal Sout1. The power amplifier 105 is connected with the transmission antenna 106, from which the amplified transmission signal Sout1 is radiated.

The reception section 19 is made up of a low-noise amplifier 108, a down-conversion mixer 109, a baseband amplifier 119, and a demodulation block 112. The reception antenna 107 is connected with the low-noise amplifier 108. The low-noise amplifier 108 amplifies a reception signal Sin2 received from the TRX 50. The low-noise amplifier 108 is connected with the down-conversion mixer 109.

The down-conversion mixer 109 is connected with local oscillation circuit 17. On the basis of the carrier signal output from the local oscillation circuit 17, the down-conversion mixer 109 down-converts the amplified reception signal Sin2 and outputs the resultant baseband signal SOUT2 to the baseband amplifier 119. The down-conversion mixer 109 is connected with the baseband amplifier 119. The baseband amplifier 119 amplifies the down-converted baseband signal SOUT2. The baseband amplifier 119 is connected with the demodulation block 112. The demodulation block 112 demodulates the amplified baseband signal SOUT2, thereby reconstructing the data DOUT2.

The TRX 50 is made up of a frequency offset detection block 27, a variable reference oscillator 28, a PLL circuit 29, a local oscillation circuit 30, a reception section 31, a transmission section 32, a reception antenna 201, and a transmission antenna 211. The frequency offset detection block 27 detects a frequency offset from demodulated data DOUT1 output from the reception section 31 and outputs a resultant frequency offset detection signal.

The frequency offset detection block 27 is connected with the variable reference oscillator 28. The variable reference oscillator 28 oscillates a reference oscillation signal to output the oscillated reference oscillation signal to the PLL circuit 29. The variable reference oscillator 28 is connected with the PLL circuit 29. The PLL circuit 29 has a frequency synthesizer function and generates an oscillation signal having two or more frequencies on the basis of the reference oscillation signal. The PLL circuit 29 is connected with the local oscillation circuit 30. The local oscillation circuit 30 generates a carrier signal having two or more local oscillation frequencies on the basis of oscillation signal having two or more frequencies:

The reception section 31 is made up of a low-noise amplifier 202, a down-conversion mixer 203, a baseband amplifier 218, and a demodulation block 205. The reception antenna 201 is connected with the low-noise amplifier 202. The low-noise amplifier 202 amplifies the reception signal Sin1 received from the TRX 40. The low-noise amplifier 202 is connected with the down-conversion mixer 203. On the basis of carrier signal output from the local oscillation circuit 30, the down-conversion mixer 203 down-converts the amplified reception signal Sin1 and outputs the resultant baseband signal SOUT1 to the baseband amplifier 218.

The down-conversion mixer 203 is connected with the baseband amplifier 218. The baseband amplifier 218 amplifies the down-converted baseband signal SOUT1. The baseband amplifier 218 is connected with the demodulation block 205. The demodulation block 205 demodulates the amplified baseband signal SOUT1, thereby reconstructing the data DOUT1.

The transmission section 32 is made up of a modulation block 206, a baseband amplifier 207, an up-conversion mixer 208, and a power amplifier 210. The modulation block 206 modulates entered data DIN2 and outputs a resultant modulated signal SIN2 to the baseband amplifier 207. The modulation block 206 is connected with the baseband amplifier 207. The baseband amplifier 207 amplifies the modulated signal SIN2.

The baseband amplifier 207 is connected with the up-conversion mixer 208. The up-conversion mixer 208 is connected with the local oscillation circuit 30. On the basis of the carrier signal output from the local oscillation circuit 30, the up-conversion mixer 208 up-converts the amplified modulated signal SIN2 and outputs the resultant transmission signal Sout2 to the power amplifier 210. The up-conversion mixer 208 is connected with the power amplifier 210. The power amplifier 210 amplifies the transmission signal Sout2. The power amplifier 210 is connected with the transmission antenna 211, from which the amplified transmission signal Sout2 is radiated.

Configuring the bidirectional wireless communication system No. 4 as described above can realize the enhancement and stabilization of the frequency accuracy of the local oscillation circuit 17 through the frequency synthesizer based on the PLL circuit 16 in the TRX 40. In addition, the enhancement and stabilization of the frequency accuracy of the local oscillation circuit 30 can be realized through the frequency synthesizer based on the PLL circuit 29 in the TRX 50.

The frequency accuracies of the local oscillation circuit 17 and the local oscillation circuit 30 depend on the reference oscillator 15 and the variable reference oscillator 28, respectively. The oscillation frequencies of the reference oscillator 15 and the variable reference oscillator 28 are different from each other between the TRX 40 and the TRX 50. Consequently, there resultantly occurs a difference between the oscillation frequencies of the TRX 40 and the TRX 50. In order to suppress this frequency difference, the frequency offset detection block 27 is arranged in the TRX 50 to control the oscillation frequency of the variable reference oscillator 28 to detect a frequency offset from the data DOUT1 obtained by demodulating the reception signal Sin1, thereby correcting the frequency difference.

For example, WCDMA (Wideband Code Division Multiple Access) demands the frequency accuracy of the variable reference oscillator 28 before the correction to be +/−2 ppm and the that after the correction to be +/−0.1 ppm. The TRX 40 uses a VCTCXO (voltage control oscillator of temperature compensation type) for the reference oscillator 15, thereby realizing these frequency accuracies in a certain temperature range (−25 degrees centigrade to +75 degrees centigrade, for example). The TRX 50 uses a pilot part of the reception signal Sin1 to detect a frequency offset to control the frequency control terminal voltage of the VCTCXO, thereby executing the fine tuning of the frequency. Thus, according to the frequency synthesizing, the absolute and relative accuracies of frequency can be controlled.

Further, a method is proposed in which, instead of the local oscillation circuit 17 and the local oscillation circuit 30 that use the PLL circuit 16 and the PLL circuit 29, for example, a free-running local oscillator of injection lock type using locking pull-in phenomenon may be used for the locking of transmission and reception frequencies. This phenomenon is described in Razavi, "A Study of Injection Locking and Pulling in Oscillators," IEEE Journal of Solid-state Circuits, Vol. 39, No. 9, September 2004, (hereinafter referred to as Non-Patent Document 1), for example. Injection locking is widely known as a phenomenon in which, when a signal having a frequency in the proximity of an oscillation frequency is injected in an oscillator, the oscillation frequency of this oscillator is pulled in the frequency of the injected signal. To be more specific, a reference carrier signal is multiplexed with a modulated signal to be injected in a free-running local oscillator, thereby causing a pull-in phenomenon. This free-running local oscillator eliminates the necessity for the PLL circuit 16 and the PLL circuit 29, thereby realizing circuit simplification.

As for a wireless communication system based on the free-running local oscillator described above, Japanese Patent Laid-open No. 2007-158851 (page 5, FIG. 2) (hereinafter referred to as Patent Document 1) discloses a bidirectional wireless communication apparatus, a bidirectional wireless communication system, and a bidirectional wireless communication method. According to this bidirectional wireless communication system, when wireless modulated signals between bidirectional wireless communication apparatuses are transmitted or received, each bidirectional wireless communication apparatus is configured by transmission means, band separation means, injection lock oscillation means, and reception control means. The transmission means transmits a wireless modulated signal generated by multiplying an intermediate frequency band modulated signal obtained by modulating a signal to be transmitted to the mate of communication into an intermediate frequency band by a local oscillation signal.

The band separation means band-separates the harmonic component of the local oscillation signal having frequency N·fLO and the wireless modulated signal component from the received reception signal. The injection lock oscillation means divides the harmonic component of the local oscillation signal separated by the band separation means by 1/N to generate a local oscillation signal having frequency fLO.

On the premise of this, the reception control means multiplies the wireless modulated signal separated by the band separation means by the harmonic component of the local oscillation signal generated by the injection lock oscillation means, thereby down-converting a resultant signal into the intermediate frequency band. Configuring the bidirectional wireless communication system as described above can lower the frequency of the local oscillation signal, so that the manufacturing processes of the bidirectional wireless communication system can be simplified, eventually leading to a significant cost reduction.

In addition, Japanese Patent Laid-open No. 2007-228499 (page 7, FIG. 2) (hereinafter referred to as Patent Document 2) discloses a signal processing apparatus and method as an example of arranging a wireless communication apparatus of injection lock type inside a device. According to the disclosed signal processing apparatus, two or more signal processing blocks for processing data signals that are signals of predetermined data are arranged in one housing. Of these two or more signal processing blocks, a predetermined signal processing block has injection lock oscillation means.

In locking with an injection signal, the injection lock oscillation means oscillates such that a carrier signal for modulating or demodulating a data signal to be transmitted to any one of the two or more signal processing blocks in a wireless manner is generated. The injection signal (or a clock signal) comes from another signal processing block or the oscillator in a wired manner. The data signal is transmitted to any one of the two or more signal processing blocks in a wireless manner.

Each signal processing block has communication means. On the premise thereof, the communication means, by use of a carrier signal, modulates data signal to be transmitted to any one of the two or more signal processing blocks in a wireless manner or demodulates a data signal coming from any one of the two or more signal processing blocks in a wireless manner. Configuring each signal processing block as described above can efficiently execute data signal transmission and reception in a wireless manner within the housing of the apparatus.

SUMMARY OF THE INVENTION

It should be noted here however that the related-art bidirectional wireless data transmission system No. 4 presents the following problems.

(i) According to the bidirectional wireless data transmission system No. 4 shown in FIG. 10, the TRX 40 must have the PLL circuit 16 for frequency synthesizer and the TRX 50 must have the frequency offset detection block 27 and the PLL circuit 29 for frequency synthesizer. However, this configuration increases the circuit scale of each of the TRX 40 and the TRX 50.

(ii) Employment of frequency synthesizing makes it difficult to correct oscillation frequency differences between the TRX 40 and the TRX 50 if a frequency offset exceeds a detection range.

(iii) The wireless communication apparatuses using the free-running local oscillator based on injection locking as shown in Patent Document 1 or Non-Patent Document 1 limit a lockable range. The lockable range herein denotes a frequency range in which the oscillation frequency of a signal oscillated by the free-running local oscillator reaches injection locking. In this lockable range, the oscillation frequency of a signal of the oscillator concerned locks with the frequency of an injected signal due to the injection lock pull-in phenomenon. Therefore, it is demanded for these wireless communication apparatuses to be designed such that the free-running oscillation frequency of the bidirectional local oscillation circuit falls within the lockable range. However, fluctuations and the like in the manufacturing of the free-running local oscillator may push the free-running oscillation frequency out of the injection locking range.

(iv) In building a bidirectional wireless communication system, the frequency locking must be shared between the TRX 40 and the TRX 50. If the injection locking is executed independently in the TRX 40 and the TRX 50, a sequence for determining the locking with each other gets complicated.

(v) According to the signal processing apparatus described in Patent Document 2 above, a method is employed in which clock signals are supplied to two or more signal processing blocks in a wired manner and data is transmitted in a wireless manner. However, in this method, a local oscillation signal injection-locked in the clock signal must be used for the modulation and demodulation of wireless signals. This configuration must lay the wiring for clock signal transmission inside the housing of each signal processing apparatus.

Therefore, the present embodiment addresses the above-identified and other problems associated with related-art methods and apparatuses and solves the addressed problems by providing a bidirectional wireless communication system, a wireless communication apparatus, and bidirectional wireless communication method that are configured such that the frequency locking circuit and so on can be implemented by circuits simpler than the circuit containing a PLL circuit by contriving the configurations and frequency locking state confirmation method of the wireless communication apparatuses of the transmission side and the reception side.

In carrying out the invention and according to one embodiment thereof, there is provided a bidirectional wireless communication system. Here let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. This bidirectional wireless communication system has a first wireless communication apparatus for bidirectional communication configured to multiplex a modulated signal obtained by modulating an input signal by a reference carrier signal having a predetermined carrier frequency, and transmit a resultant transmission signal; and a second wireless communication apparatus, having an oscillator for oscillating a signal having a free-running oscillation frequency, configured to inject a reception signal received from the first wireless communication apparatus into the oscillator, receive the reception signal while variably controlling the free-running oscillation frequency of the oscillator of the second wireless communication apparatus, detect whether the free-running oscillation frequency of the signal of the oscillator of the second wireless communication apparatus has entered the frequency range up to the injection locking to be frequency-locked with a carrier frequency of the injected reception signal, and generate a communication enable signal. In the above-mentioned configuration, if the free-running oscillation frequency of the signal of the oscillator of the second wireless communication apparatus is found frequency-locked with the carrier frequency of the injected reception signal, then the second wireless communication apparatus transmits the communication enable signal to the first wireless communication apparatus.

According to the first bidirectional wireless communication system associated with the invention, the first wireless communication apparatus multiplexes a modulated signal obtained by modulating an input signal by a reference carrier signal having a predetermined carrier frequency and transmits a resultant transmission signal. The second wireless communication apparatus injects a reception signal received from the first wireless communication apparatus into the oscillator, receives the reception signal while variably controlling the free-running oscillation frequency of the oscillator, detects whether the free-running oscillation frequency of the signal of the oscillator has entered the frequency range up to injection locking to be frequency-locked with the carrier frequency of the injected reception signal, and generates a communication enable signal. If the free-running oscillation frequency is found frequency-locked with the carrier frequency of the injected reception signal, the second wireless communication apparatus transmits the generated communication enable signal to the first wireless communication apparatus. Consequently, the first wireless communication apparatus becomes ready for detecting (or recognizing) on the basis of the communication enable signal that the frequency locking with the second wireless communication apparatus has been completed and both the wireless communication apparatus is in a communicable state.

In carrying out the invention and according to another embodiment thereof, there is provided a first wireless communication apparatus practiced as another embodiment of the invention. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. Then, wireless communication is executed with a mate wireless communication apparatus that has an oscillator for oscillating a signal having a free-running oscillation frequency in which a received reception signal is injected in the oscillator, receives the reception signal while variably controlling the free-running oscillation frequency of the oscillator, detects whether the free-running oscillation frequency of the signal of the oscillator has entered a frequency range up to the injection locking to be frequency-locked with the carrier frequency of the injected reception signal, and generates a communication enable signal. This first wireless communication apparatus has a transmission section configured to multiplex a modulated signal obtained by modulating an input signal with a reference carrier signal having a predetermined carrier frequency and transmit a resultant transmission signal to the mate wireless communication apparatus; and a reception section configured to receive the communication enable signal from the mate wireless communication apparatus if the free-running oscillation frequency of the signal of the oscillator of the mate wireless communication apparatus is found entered the frequency range up to the injection locking to be frequency-locked with the carrier frequency of the injected reception signal.

According to the first wireless communication apparatus associated with the embodiment, the transmission section multiplexes a modulated signal obtained by modulating an input signal by the reference carrier signal having a predetermined carrier frequency and transmits a resultant transmission signal to the mate wireless communication apparatus. On this premise, if the free-running oscillation frequency of the oscillator of the mate wireless communication apparatus has been frequency-locked with the carrier frequency of the injected reception signal, the reception section is ready for receiving a communication enable signal from the mate wireless communication apparatus. Consequently, the first wireless communication apparatus can detect (or recognize) on the basis of the communication enable signal that the frequency locking with the mate wireless communication apparatus has been completed and both the wireless communication apparatuses are in a communicable state.

In carrying out the invention and according to still another embodiment thereof, there is provided a second wireless communication apparatus. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. Then, wireless communication is executed with a wireless communication apparatus on the transmission side that multiplexes a modulated signal obtained by modulating an input signal by a reference carrier signal having a predetermined carrier frequency, transmits a resultant transmission signal, and receives at least a communication enable signal. This second wireless communication apparatus has a reception section configured to have an oscillator for oscillating a signal having a free-running oscillation frequency, inject a reception signal received from the wireless communication apparatus on the transmission side into the oscillator, and receives the reception signal while variably controlling the free-running oscillation frequency of the oscillator; a signal generation block configured to detect whether the free-running oscillation frequency of the signal of the oscillator has entered the frequency range up to the injection locking to be frequency-locked with the carrier frequency of the injected reception signal and generate a communication enable signal; and a transmission section configured to transmit the communication enable signal generated by the signal generation block to the wireless communication apparatus on the transmission side.

According to the second wireless communication apparatus associated with the embodiment, the reception section injects a reception signal received from the wireless communication apparatus on the transmission side into the oscillator and receives the reception signal while variably controlling the free-running oscillation frequency of this oscillator. The signal generation block detects whether the free-running oscillation frequency of the signal of the oscillator has entered the frequency range up to the injection locking to be frequency-locked with the carrier frequency of the injected reception signal and generates a communication enable signal. On this premise, if the free-running oscillation frequency is found by the signal generation block to have been frequency-locked, then the transmission section transmits the generated communication enable signal to the wireless communication apparatus on the transmission side. Consequently, the wireless communication apparatus on the reception side can detect (or recognize) that the frequency locking with the mate wireless communication apparatus has been completed and both the wireless communication apparatuses are in a communicable state.

In carrying out the invention and according to yet another embodiment thereof, there is provided a first bidirectional wireless communication method. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. This first bidirectional wireless communication method has the steps of: in a first wireless communication apparatus for bidirectional communication, multiplexing a modulated signal obtained by modulating an input signal by a reference carrier signal having a predetermined carrier frequency and transmitting a resultant transmission signal; in a second wireless communication apparatus, having an oscillator configured to oscillate a signal having a free-running oscillation frequency, injecting a reception signal received from the first wireless communication apparatus into the oscillator, receiving the reception signal while variably controlling the free-running oscillation frequency of the oscillator of the second wireless communication apparatus, detecting whether the free-running oscillation frequency of the signal of the oscillator of the second wireless communication apparatus has entered the frequency range up to the injection locking to be frequency-locked with a carrier frequency of the injected reception signal, and generating a communication enable signal; and if the free-running oscillation frequency of the signal of the oscillator of the second wireless communication apparatus is found frequency-locked with the carrier frequency of the injected reception signal, transmitting the communication enable signal to the first wireless communication apparatus.

In carrying out the invention and according to a different embodiment thereof, there is provided a second bidirectional wireless communication system. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. This second bidirectional wireless communication system has a first wireless communication apparatus for bidirectional communication configured, when multiplexing a modulated signal obtained by modulating an input signal by a reference carrier signal having a predetermined carrier frequency, and transmitting a resultant transmission signal, to transmit the transmission signal while variably controlling the carrier frequency of the reference carrier signal; and a second wireless communication apparatus, having an oscillator configured to oscillate a signal having a free-running oscillation frequency, configured to inject a reception signal received from the first wireless communication apparatus into the oscillator, detect whether the free-running oscillation frequency of the signal of the oscillator of the second wireless communication apparatus has entered the frequency range up to the injection locking to be frequency-locked with a carrier frequency of the injected reception signal, generate a communication enable signal, and if the free-running oscillation frequency of the signal of the oscillator of the second wireless communication apparatus is found frequency-locked with the carrier frequency of the injected reception signal, transmit the communication enable signal to the first wireless communication apparatus.

According to the second bidirectional wireless communication system associated with the invention, when multiplexing a modulated signal obtained by modulating an input signal by the reference carrier signal having a predetermined carrier frequency and transmitting a resultant transmission signal, the first wireless communication apparatus transmits this transmission signal while variably controlling the carrier frequency of the reference carrier signal. The second wireless communication apparatus injects a reception signal received from the first wireless communication apparatus into the oscillator, detects whether the free-running oscillation frequency of the oscillator has entered the frequency range up to the injection locking to be frequency-locked with the carrier frequency of the injected reception signal, and generates a communication enable signal. If the free-running oscillation frequency of the signal of the oscillator is found frequency-locked with the carrier frequency of the injected reception signal, the second wireless communication apparatus transmits the generated communication enable signal to the first wireless communication apparatus. Consequently, the first wireless communication apparatus can detect (or recognize) on the basis of the communication enable signal that the frequency locking with the second wireless communication apparatus has been completed and both the wireless communication apparatuses are in a communicable state.

In carrying out the invention and according to a still different embodiment thereof, there is provided a third wireless communication apparatus. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. Then, wireless communication is executed with a mate wireless communication apparatus that has an oscillator for oscillating a signal having a free-running oscillation frequency in which a received reception signal is injected in the oscillator, receives the reception signal while variably controlling the free-running oscillation frequency of the oscillator, detects whether the free-running oscillation frequency of the signal of the oscillator has entered a frequency range up to the injection locking to be frequency-locked with the carrier frequency of the injected reception signal, and generates a communication enable signal. This third wireless communication apparatus has a transmission section configured, when multiplexing a modulated signal obtained by modulating an input signal by a reference carrier signal having a predetermined carrier frequency and transmitting a resultant transmission signal to the mate wireless communication apparatus, to transmit the transmission signal while variably controlling the carrier frequency of the reference carrier signal; and a reception section configured to receive a communication enable signal from the mate wireless communication apparatus when the free-running oscillation frequency of the signal of the oscillator of the mate wireless communication apparatus has entered the frequency range up to the injection locking to be frequency-locked with the carrier frequency of the injected reception signal.

According to the third wireless communication apparatus associated with the embodiment, when multiplexing a modulated signal obtained by modulating an input signal by the reference carrier signal having predetermined carrier frequency and transmitting a resultant transmission signal to the mate wireless communication apparatus, the transmission section transmits the transmission signal while variably controlling the carrier frequency of the reference carrier signal. On this premise, the reception section receives a communication enable signal from the mate wireless communication apparatus when the free-running oscillation frequency of the oscillator of the mate wireless communication apparatus has frequency-locked with the injected reception signal. Consequently, the third wireless communication apparatus can detect (or recognize) on the basis of the communication enable signal that the frequency locking with the mate wireless communication apparatus has been completed and both the wireless communication apparatuses are in a communicable state.

In carrying out the invention and according to a yet different embodiment thereof, there is provided a fourth wireless communication apparatus. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. Then, wireless communication is executed with a wireless communication apparatus on the transmission side that transmits a resultant transmission signal while variably controlling the carrier frequency of the reference carrier signal and receives at least a communication enable signal when multiplexing a modulated signal obtained by modulating an input signal by a reference carrier signal having a predetermined carrier frequency and transmitting a resultant transmission signal. This fourth wireless communication apparatus has a reception section, having an oscillator for oscillating a signal having a free-running oscillation frequency, configured to inject a reception signal received from the wireless communication apparatus on the transmission side into the oscillator and receive the reception signal; a signal generation block configured to detect whether the free-running oscillation frequency of the signal of the oscillator has entered a frequency range up to the injection locking to be frequency-locked with the carrier frequency of the injected reception signal and generate a communication enable signal; and a transmission section configured to transmit the communication enable signal generated by the signal generation block to the wireless communication apparatus on the transmission side.

According to the fourth wireless communication apparatus associated with the embodiment, the reception section, having an oscillator for oscillating a signal having a free-running oscillation frequency, injects a reception signal received from the wireless communication apparatus on the transmission side into the oscillator and receive the reception signal; a signal generation block detects whether the free-running oscillation frequency of the signal of the oscillator has entered a frequency range up to the injection locking to be frequency-locked with the carrier frequency of the injected reception signal and generate a communication enable signal; and on this premise, if the free-running oscillation frequency of the signal of the ascillator is found frequency locked with the carrier frequency of the injected reception signal, a transmission section transmits the communication enable signal generated by the signal generation block to the wireless communication apparatus on the transmission side. Consequently, the fourth wireless communication apparatus can detect (or recognize) on the basis of the communication enable signal that the frequency locking with the mate wireless communication apparatus has been completed and both the wireless communication apparatuses are in a communicable state.

In carrying out the invention and according to a separate embodiment thereof, there is provided a second bidirectional wireless communication method. Here, let a phenomenon in which injecting a signal having a frequency in the proximity of an oscillation frequency into an oscillator causes the oscillation frequency of the oscillator to be pulled in the frequency of the injected signal be injection locking. Let another phenomenon in which, when the oscillation frequency of the signal oscillated by the oscillator enters a frequency range up to the injection locking, the oscillation frequency of the signal of the oscillator is locked with the frequency of the injected signal by the pull-in phenomenon of the injection locking be frequency locking. This second bidirectional wireless communication method has the steps of: when multiplexing a modulated signal obtained by modulating an input signal by a reference carrier signal having a predetermined carrier frequency and transmitting a resultant transmission signal, transmitting, by a first wireless communication apparatus for bidirectional communication, the transmission signal while variably controlling the carrier frequency of the reference carrier signal; injecting, by a second wireless communication apparatus having an oscillator for oscillating a signal having a free-running oscillation frequency, a reception signal received from the first wireless communication apparatus into the oscillator of the second wireless communication apparatus, detecting whether the free-running oscillation frequency of the signal of the oscillator of the second wireless communication apparatus has entered the frequency range up to the injection locking to be frequency-locked with the carrier frequency of the injected reception signal, and generating a communication enable signal; and if the free oscillation frequency of the signal of the oscillator is found frequency-locked with the carrier frequency of the injected reception signal, transmitting the communication enable signal to the first wireless communication apparatus.

According to the first bidirectional wireless communication system and the first bidirectional wireless communication method, the second wireless communication apparatus detects that the free-running oscillation frequency of a signal oscillated by the oscillator has entered a frequency range up to injection locking to be frequency-locked with the carrier frequency of the injected reception signal. When this frequency locking is detected, the second wireless communication apparatus transmits a communication enable signal to the first wireless communication apparatus.

The above-mentioned configuration allows the first wireless communication apparatus to detect (or recognize) on the basis of the communication enable signal that the frequency locking with the second wireless communication apparatus has been completed and both the wireless communication apparatuses are in a communicable state. Consequently, when data is transmitted from the first wireless communication apparatus to the second wireless communication apparatus after the frequency locking, the second wireless communication apparatus can reconstruct the data on the basis of the signal having the oscillation frequency after the frequency locking. Besides, as compared with a related-art circuit having a PLL circuit, a frequency locking circuit and the like can be each configured with a simpler circuit.

According to the first wireless communication apparatus associated with the embodiment, when the frequency locking of the free-running oscillation frequency of the oscillator on the reception side with the carrier frequency of the injected reception is detected, the first wireless communication apparatus receives a communication enable signal from the mate wireless communication apparatus.

The above-mentioned configuration allows the first wireless communication apparatus to detect (or recognize) on the basis of the communication enable signal that the frequency locking with the mate wireless communication apparatus has been completed and both the wireless communication apparatuses are in a communicable state. Consequently, when data is transmitted from this wireless communication apparatus to the mate wireless communication apparatus after the frequency locking, the mate wireless communication apparatus can reconstruct the data on the basis of the signal having the oscillation frequency after the frequency locking. Besides, as compared with a related-art circuit having a PLL circuit, a frequency locking circuit and the like can be each configured with a simpler circuit.

According to the second wireless communication apparatus associated with the embodiment, the second wireless communication apparatus can detect that the free-running oscillation frequency of the oscillator has entered the frequency range up to injection locking to be frequency-locked with the carrier frequency of the injected reception signal. When this frequency locking is detected, the transmission section transmits a communication enable signal to the wireless communication apparatus on the transmission side.

The above-mentioned configuration allows the second wireless communication apparatus to detect (or recognize) on the basis of the communication enable signal that the frequency locking with the mate wireless communication apparatus has been completed and both the wireless communication apparatuses are in a communicable state. Consequently, receiving data from the mate wireless communication apparatus after the frequency locking, the wireless communication apparatus concerned can reconstruct the received data on the basis of the signal having the oscillation frequency after the frequency locking. Besides, as compared with a related-art circuit having a PLL circuit, a frequency locking circuit and the like can be each configured with a simpler circuit.

According to the second bidirectional wireless communication system and the second bidirectional wireless communication method, a modulated signal obtained by modulating an input signal is multiplexed with a reference carrier signal having a predetermined carrier frequency and a resultant transmission signal is transmitted. In this transmission, the transmission signal is transmitted while the first wireless communication apparatus variably controls the carrier frequency of the reference carrier signal. When the second wireless communication apparatus detects that the free-running oscillation frequency of the signal oscillated by the oscillator has entered the frequency range up to injection locking to be frequency-locked with the carrier frequency of the injected reception signal, a communication enable signal is transmitted to the first wireless communication apparatus.

The above-mentioned configuration allows the first wireless communication apparatus to detect (or recognize) on the basis of the communication enable signal that the frequency locking with the second wireless communication apparatus has been completed and both the wireless communication apparatuses are in a communicable state. Consequently, when data is transmitted from the first wireless communication apparatus to the second wireless communication apparatus after the frequency locking, the second wireless communication apparatus can reconstruct the data on the basis of the signal having the oscillation frequency after the frequency locking. Besides, as compared with a related-art circuit having a PLL circuit, a frequency locking circuit and the like can be each configured with a simpler circuit.

According to the third wireless communication apparatus associated with the embodiment, a transmission section is arranged that transmits a transmission signal while variably controlling the carrier frequency of a reference carrier signal. When the third wireless communication apparatus detects that the free-running oscillation frequency of the oscillator on the reception side has entered the frequency range up to injection locking to be frequency-locked with the carrier frequency of the injected reception signal, the third wireless communication apparatus receives a communication enable signal from the mate wireless communication apparatus.

The above-mentioned configuration allows the third wireless communication apparatus to detect (or recognize) on the basis of the communication enable signal that the frequency locking with the mate wireless communication apparatus has been completed and both the wireless communication apparatuses are in a communicable state. Consequently, when data is transmitted from the wireless communication apparatus concerned to the mate wireless communication apparatus after the frequency locking, the mate wireless communication apparatus can reconstruct the data on the basis of the signal having the oscillation frequency after the frequency locking. Besides, as compared with a related-art circuit having a PLL circuit, a frequency locking circuit and the like can be each configured with a simpler circuit.

According to the fourth wireless communication apparatus associated with the embodiment, a signal generation block is arranged for detecting whether the free-running oscillation frequency of the signal of the oscillator has entered the frequency range up to injection locking to be frequency-locked with the carrier frequency of the injected reception signal and generating a communication enable signal. When the frequency locking is found between the free-running oscillation frequency of the oscillator on the reception side and the carrier frequency of the injected reception signal, the transmission section transmits the generated communication enable signal to the wireless communication apparatus on the transmission side.

The above-mentioned configuration allows the fourth wireless communication apparatus to detect (or recognize) on the basis of the communication enable signal that the frequency locking with the mate wireless communication apparatus has been completed and both the wireless communication apparatuses are in a communicable state. Consequently, when data is received from the mate wireless communication apparatus after the frequency locking, the wireless communication apparatus concerned can reconstruct the data on the basis of the signal having the oscillation frequency after the frequency locking. Besides, as compared with a related-art circuit having a PLL circuit, a frequency locking circuit and the like can be each configured with a simpler circuit.

BRIEF DESCRIPTION OF THE DRAWINGS

Other objects and aspects of the invention will become apparent from the following description of embodiments with reference to the accompanying drawings in which:

FIGS. 5A and 5B are sequence charts indicative of a wireless communication example in the bidirectional wireless data transmission system practiced as the first embodiment of the invention;

FIGS. 9A and 9B are sequence charts indicative of a wireless communication example in the bidirectional wireless data transmission system No. 3.

DETAILED DESCRIPTION OF THE PREFERRED EMBODIMENTS

This invention will be described in further detail by way of embodiments thereof, namely, a bidirectional wireless data transmission system, a wireless communication apparatus, and a bidirectional wireless communication method, with reference to the accompanying drawings. The explanation will be made in the following order:

(1) the first embodiment (an exemplary configuration and an exemplary wireless communication of the bidirectional wireless data transmission system No. 1);

(2) the second embodiment (an exemplary configuration and an exemplary wireless communication of the bidirectional wireless data transmission system No. 2); and (3) the third embodiment (an exemplary configuration and an exemplary wireless communication of the bidirectional wireless data transmission system No. 3).

The First Embodiment

Figure 1:
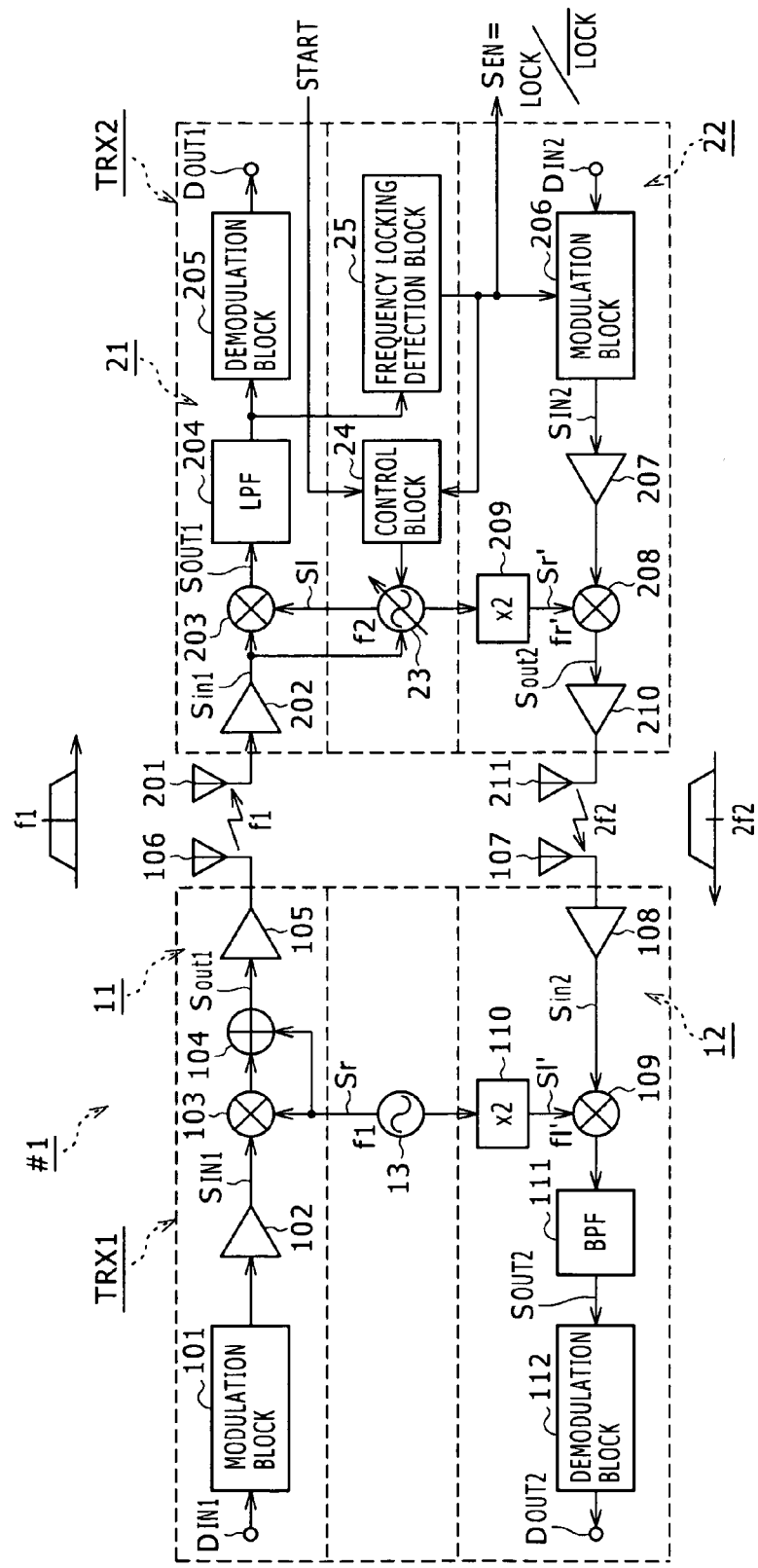
FIG. 1 is a block diagram illustrating an exemplary configuration of a bidirectional wireless data transmission system No. 1 practiced as a first embodiment of the invention.

Now, referring to FIG. 1, a bidirectional wireless data transmission system No. 1 practiced as the first embodiment of the invention will be described. The bidirectional wireless data transmission system No. 1 shown in FIG. 1 constitutes one example of a bidirectional wireless communication system and transmits signals of a millimeter band having frequencies 30 GHz to 300 GHz at high speeds. Millimeter band signals carry movie images, computer graphics, and the like between devices arranged in proximity and inside each device. This is applicable to an asymmetrical wireless data transmission system for realizing frequency locking based on injection locking by use of different carrier frequencies in transmission and reception.

This injection locking herein denotes a phenomenon in which, when a signal having a frequency in the proximity of an oscillation frequency is injected in an oscillator, the oscillation frequency of this oscillator is pulled into the frequency of the injected signal. The frequency locking herein denotes a phenomenon in which, when the oscillation frequency of a signal oscillated by an oscillator gets in a frequency range up to the injection locking, the oscillation frequency of the signal of the oscillator locks with the frequency of the injected signal due to the above-mentioned injection locking pull-in phenomenon.

The bidirectional wireless data transmission system No. 1 is composed of two wireless communication apparatuses; a bidirectional wireless communication apparatus on the transmission side configuring one example of a first wireless communication apparatus and a second bidirectional wireless communication apparatus on the reception side configuring one example of a second wireless communication apparatus, for example. The bidirectional wireless communication apparatus on the transmission side is hereafter abbreviated to a TRX1. The second bidirectional wireless communication apparatus on the reception side is hereafter abbreviated to a TRX2. In this example, an oscillator 23 is arranged on the receiving TRX2 to vary free-running oscillation frequency f2 of this oscillator 23 to capture free-running oscillation frequency f2 into the frequency range, thereby detecting frequency locking. A bidirectional frequency locking state can be confirmed by transmitting and receiving signals in the millimeter band by use of this detection as a trigger.

The TRX1 multiplexes modulated signal SIN1 obtained by modulating an input signal (hereafter referred to as data DIN1) with reference carrier signal Sr having predetermined carrier frequency f1 and transmits resultant transmission signal Sout1. For example, the TRX1 is composed of a transmission section 11, a reception section 12, an oscillator 13, a transmission antenna 106, and a reception antenna 107.

For the oscillator 13, a single voltage control oscillator for local oscillation is used. In this example, the oscillator 13 is sharably used between the transmission section 11 and the reception section 12. The transmission section 11 executes transmission processing on the basis of reference carrier signal Sr having carrier frequency f1 (oscillation frequency) oscillated by the oscillator 13. The reception section 12 executes reception processing on the basis of local oscillation signal Sl' having local oscillation frequency f1' obtained by multiplying reference carrier signal Sr oscillated by the oscillator 13. In this example, one oscillator 13 simultaneously controls carrier frequency f1 of the transmission section 11 and local oscillation frequency f1' of the reception section 12. This control processing can lock carrier frequency f1 with free-running oscillation frequency f2 at all the times of transmission and reception between the wireless communication apparatuses TRX1 and TRX2 if frequency locking is established between the wireless communication apparatuses TRX1 and TRX2.

The transmission section 11 is composed of a modulation block 101, a baseband amplifier 102, an up-conversion mixer 103, an adder 104, and a power amplifier 105. The modulation block 101 receives data DIN1, modulates this data DIN1, and outputs modulated signal SIN1. The modulation block 101 is connected with the baseband amplifier 102. The baseband amplifier 102 amplifies modulated signal SIN1.

The baseband amplifier 102 is connected with the up-conversion mixer 103. The up-conversion mixer 103 executes up-conversion processing (the multiplication processing for frequency conversion) on amplified modulated signal SIN1 (baseband signal) and reference carrier signal Sr having carrier frequency f1 and outputs a resultant frequency converted signal.

The up-conversion mixer 103 is connected with the adder 104. The adder 104 outputs transmission signal Sout1 obtained by adding (multiplexing) reference carrier signal Sr having carrier frequency f1 to the up-converted frequency-converted signal. Reference carrier signal Sr is added to this frequency-converted signal in order to make it easy to execute the injection locking based on reference carrier signal Sr in the TRX2.

Obviously, reference carrier signal Sr having unmodulated carrier frequency f1 may be transmitted to the TRX2 without adding reference carrier signal Sr to the frequency converted signal. The transmission timing may be an injection locking control period between the TRX1 and the TRX2 and the frequency locking based on the injection locking may be executed in this injection locking control period. The injection locking control period herein denotes a period in which injection locking is executed such that reference carrier signal Sr having carrier frequency f1 on the transmission side is matched with local oscillation signal Sl based on free-running oscillation frequency f2 on the reception side.

The adder 104 is connected with the power amplifier 105. the power amplifier 105 amplifies transmission signal Sout1 after addition and outputs amplified transmission signal Sout1 from the transmission antenna 106. The transmission antenna 106 receives transmission signal Sout1 and radiates electromagnetic waves. Consequently, the transmission section 11 is ready for transmitting transmission signal Sout1 with reference carrier signal Sr having predetermined carrier frequency f1 multiplied with modulated signal SIN1 obtained by modulating data DIN1 to the communication mate TRX2.

The reception section 12 is composed of a low-noise amplifier 108, a down-conversion mixer 109, a frequency multiplier 110, a bandpass filter 111, and a demodulation block 112. The reception antenna 107 is connected with the low-noise amplifier 108. The low-noise amplifier 108 amplifies reception signal Sin2 received by the reception antenna 107. Reception signal Sin2 contains a carrier signal that is two times as high as free-running oscillation frequency f2. Reception signal Sin2 contains enable signal SEN coming from the TRX2 at the time of injection locking.

The low-noise amplifier 108 is connected with the down-conversion mixer 109. The down-conversion mixer 109 is connected with the frequency multiplier 110. The frequency multiplier 110, connected to the oscillator 13, outputs local oscillation signal Sl' of 2×f1 obtained by multiplying carrier frequency f1 by 2 to the down-conversion mixer 109. The down-conversion mixer 109 down-converts (subtracts) reception signal Sin2 on the basis of local oscillation signal Sl' output from the frequency multiplier 110, thereby demodulating baseband signal SOUT2 (demodulated signal).

The down-conversion mixer 109 is connected with the bandpass filter 111. The bandpass filter 111 passes baseband signal SOUT2 containing enable signal SEN at the time of injection locking. The bandpass filter 111 is connected with the demodulation block 112. The demodulation block 112 demodulates baseband signal SOUT2 and outputs data DOUT2 that contains enable signal SEN.

When the TRX1 is configured as described above, free-running oscillation frequency f2 of local oscillation signal Sl of the oscillator 23 of the TRX2 gets in the frequency range up to the injection locking and frequency-locks with carrier frequency f1 of injected reception signal Sin1 in the reception section 12. Then, upon the establishment of the frequency locking, the TRX1 is ready for receive enable signal SEN from the TRX2. Consequently, the frequency locking with the communication mate TRX2 is completed on the basis of enable signal SEN and the TRX1 is ready for detecting (recognizing) a communication enabled state.

In addition, the TRX2 has a single local oscillator of free-running oscillating injection locking type (hereafter simply referred to as an oscillator 23). The oscillator 23 oscillates local oscillation signal Sl having free-running oscillation frequency f2. For the oscillator 23, a voltage control oscillator is used.

The TRX2 injects received reception signal Sin1 into the oscillator 23 and receives reception signal Sin1 while variably controlling free-running oscillation frequency f2 of the oscillator 23. The TRX2 detects whether free-running oscillation frequency f2 of local oscillation signal Sl has entered the frequency range up to the injection locking to be frequency-locked with carrier frequency f1 of injected reception signal Sin1. If the frequency locking is detected, the TRX2 generates communication enable signal (hereafter simply referred to as an enable signal SEN).

In the TRX2, the oscillator 23 is also sharably used between a reception section 21 and a transmission section 22. The reception section 21 is configured to execute reception processing on the basis of local oscillation signal Sl having free-running oscillation frequency f2 after injection locking oscillated by the oscillator 23. The transmission section 22 is configured to execute transmission processing on the basis of carrier signal Sr' obtained by multiplying local oscillation signal Sl after injection locking oscillated by the oscillator 23. In this example, one oscillator 23 simultaneously controls both free-running oscillation frequency f2 of the reception section 21 and carrier frequency fr' of the transmission section 22. This control processing can lock carrier frequency f1 with free-running oscillation frequency f2 at all the times of transmission and reception between the TRX1 and the TRX2 if frequency locking is established between the TRX1 and the TRX2.

In addition to the oscillator 23, the TRX2 is composed of the reception section 21, the transmission section 22, a control block 24, a frequency locking detection block 25, the reception antenna 201, and the transmission antenna 211. The control block 24 and the frequency locking detection block 25 constitute one example of a signal generation unit.

The reception section 21 injects reception signal Sin1 received from the TRX1 into the oscillator 23 and receives reception signal Sin1 while variably controlling free-running oscillation frequency f2 of the oscillator 23. For example, the reception section 21 is composed of the low-noise amplifier 202, the down-conversion mixer 203, a lowpass filter 204, and the demodulation block 205.

The reception antenna 201 is connected with the low-noise amplifier 202. The low-noise amplifier 202 amplifies reception signal Sin1 received by the reception antenna 201. Reception signal Sin1 contains carrier frequency f1. The low-noise amplifier 202 is connected with the down-conversion mixer 203 and the oscillator 23. The down-conversion mixer 203 is connected with the oscillator 23. Into the oscillator 23, amplified reception signal Sin1 is injected.

The down-conversion mixer 203 outputs baseband signal SOUT1 obtained by executing down-conversion processing (subtraction) on reception signal Sin1 on the basis of local oscillation signal Sl having free-running oscillation frequency f2 output from the oscillator 23. The down-conversion mixer 203 is connected with the lowpass filter 204. The lowpass filter 204 removes the low-frequency component from baseband signal SOUT1 to pass baseband signal SOUT1 removed of the low-frequency component. The lowpass filter 204 is connected with the frequency locking detection block 25 and the demodulation block 205. The demodulation block 205 demodulates baseband signal SOUT1 to output data DOUT1.

The oscillator 23 is connected with the control block 24 that constitutes a part of the signal generation unit. The control block 24 reception-controls reception signal Sin1 while variably controlling free-running oscillation frequency f2 of the oscillator 23 with reception signal Sin1 injected. The frequency locking detection block 25 constitutes a part of the signal generation unit and detects whether free-running oscillation frequency f2 of local oscillation signal Sl has been frequency-locked with carrier frequency f1 of reception signal Sin1. If the frequency locking is detected, the frequency locking detection block 25 generates enable signal SEN. Enable signal SEN is output to the control block 24 and the transmission section 22 when the oscillator 23 is frequency-locked by injection locking.

If frequency locking of free-running oscillation frequency f2 is found locked with carrier frequency f1 of injected reception signal Sin1 in the frequency locking detection block 25, the transmission section 22 transmits enable signal SEN to the TRX1. The transmission section 22 is composed of the modulation block 206, the baseband amplifier 207, the up-conversion mixer 208, a frequency multiplier 209, and the power amplifier 210.

The modulation block 206 receives data DIN2, modulates received data DIN2, and outputs modulated signal SIN2. In this example, free-running oscillation frequency f2 of the oscillator 23 is frequency-locked with carrier frequency f1 of injected reception signal Sin1. In the frequency locking, the modulation block 206 modulates enable signal SEN output from the frequency locking detection block 25 to output modulated signal SIN2 containing enable signal SEN.

The modulation block 206 is connected with the baseband amplifier 207. The baseband amplifier 207 amplifies the modulated signal SIN2. The baseband amplifier 207 is connected with the up-conversion mixer 208. The up-conversion mixer 208 and the above-mentioned oscillator 23 are connected with the frequency multiplier 209. The frequency multiplier 209 outputs carrier frequency fr'=2·f2 obtained by multiplying free-running oscillation frequency f2 by 2 to the up-conversion mixer 208.

The up-conversion mixer 208 executes up-conversion processing (multiplication processing for frequency conversion) on amplified modulated signal SIN2 and carrier signal Sr' having carrier frequency fr' and outputs resultant transmission signal Sout2. The up-conversion mixer 208 is connected with the power amplifier 210. The power amplifier 210 amplifies up-converted transmission signal Sout2 and outputs amplified transmission signal Sout2 to the transmission antenna 211. The transmission antenna 211 receives transmission signal Sout2 and radiates electromagnetic waves. Consequently, the transmission section 22 is ready for transmitting transmission signal Sout2 with modulated signal SIN2 containing enable signal SEN multiplied by carrier signal Sr' having predetermined carrier frequency fr' to communication mate TRX1.

Also, in carrier frequency f1 in the transmission section 11 of the TRX1 and carrier frequency fr' in the transmission section 22 of the TRX2, relation M/N is set between carrier frequency f1 of the TRX1 and carrier frequency fr'=2·f1 of the TRX2. It should be noted that M and N are given integers. For example, if carrier frequency f1 in the TRX1 is set to 60 GHz, then carrier frequency fr' in the TRX2 is set to 120 GHz. Namely, f1:fr'=60:120=M:N (2:1) in this example.

Obviously, carrier signal Sr' obtained by dividing local oscillation signal Sl having free-running oscillation frequency f2 may be used. For example, if carrier frequency f1 in the TRX1 is set to 60 GHz, then carrier frequency fr' in the TRX2 is set to 30 GHz. Namely, f1:fr'=60:30=M:N (2:1) in this example.

Figure 2A:
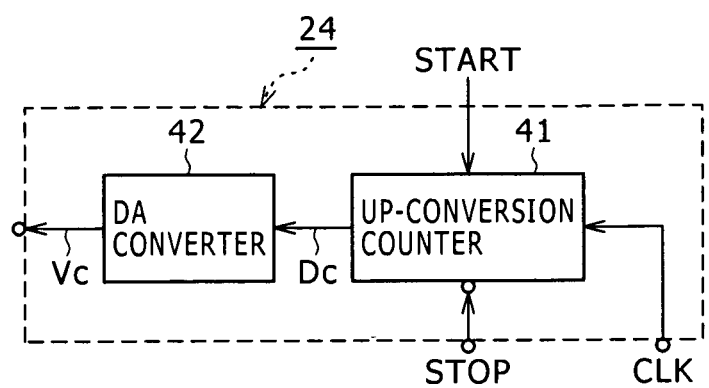
FIGS. 2A and 2B are block diagrams illustrating exemplary internal configurations of a control block and a frequency locking detection block.
Figure 2B:
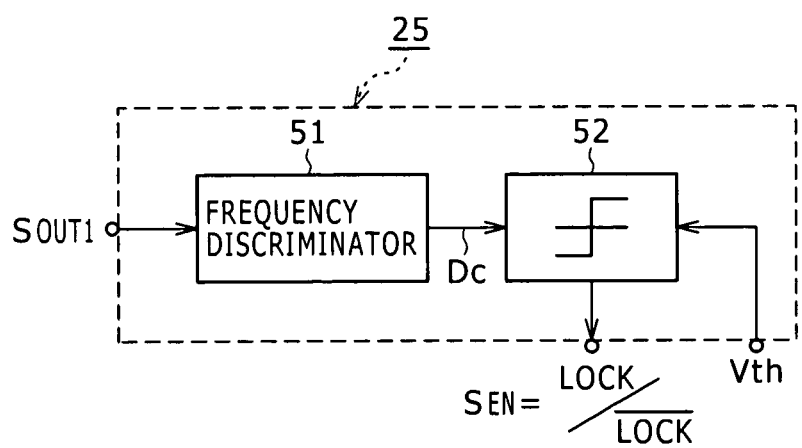

The following describes exemplary internal configurations of the control block 24 and the frequency locking detection block 25 with reference to FIGS. 2A and 2B. In order to variably control free-running oscillation frequency f2 of the oscillator 23, the control block 24 is composed of an up-counter 41 and a digital/analog converter (hereafter referred to as a DA conversion 42). The up-counter 41 up-counts the number of pulses of clock signal CLK for example on the basis of start signal Start and outputs oscillation control data Dc and, on the basis of stop signal Stop, stops outputting oscillation control data Dc. The up-counter 41 is connected with the DA converter 42.

The DA converter 42 digital-to-analog converts oscillation control data Dc to generate analog VCO control voltage Vc. VCO control voltage Vc is output to the oscillator 23. If VCO control voltage Vc gets higher than a certain reference voltage, the oscillator 23 decreases free-running oscillation frequency f2. If VCO control voltage Vc gets lower than a certain reference voltage, the oscillator 23 increases free-running oscillation frequency f2.

The control block 24 repeatedly increases or decreases free-running oscillation frequency f2 of the oscillator 23 within a frequency range up to injection locking, thereby executing variable tuning. This allows variable control on free-running oscillation frequency f2 of the oscillator 23 in which reception signal Sin1 has been injected. The reception section 21 is configured as described above. In this reception section 21, free-running oscillation frequency f2 of local oscillation signal Sl by the oscillator 23 can be forcibly injected brought into the frequency range up to injection locking, thereby forcibly frequency-locking free-running oscillation frequency f2 with carrier frequency f1 of injected reception signal Sin1.

With the frequency locking detection block 25 shown in FIG. 2B, the oscillator 23 is variably controlled by the control block 24. Whether free-running oscillation frequency f2 of local oscillation signal Sl of the oscillator 23 has entered the frequency range up to injection locking to be frequency-locked with carrier frequency f1 of injected reception signal Sin1 is determined. If the frequency locking is found, then enable signal SEN is generated. Enable signal SEN is divided into LOCK indicative of signal logic that the frequency locking has been found and inverted LOCK (the upperline omitted here) indicative of signal logic that the frequency locking has not been found.

The frequency locking detection block 25 is composed of a frequency discriminator 51 and a comparator 52, for example. The frequency discriminator 51 converts a frequency variation of baseband signal SOUT1 obtained by demodulating reception signal Sin1 into an amplitude value. Frequency-discriminated amplitude value is output to the comparator 52. The frequency discriminator 51 is connected with the comparator 52. The comparator 52 compares the amplitude value obtained from the frequency discriminator 51 with a preset comparison reference value to determine whether free-running oscillation frequency f2 of the oscillator 23 has been frequency-locked with carrier frequency f1 of injected reception signal Sin1. The comparison reference value is given by threshold voltage Vth output from an upper control system, for example.

If the amplitude value obtained from the frequency discriminator 51 is found matching the preset comparison reference value, then the comparator 52 outputs enable signal SEN=LOCK indicative of the completion of injection locking. If the amplitude value obtained from the frequency discriminator 51 is found not matching the preset comparison reference value, then the comparator 52 outputs enable signal SEN=inverted LOCK (the upperline omitted here) indicative of the incompletion of injection locking. Enable signals SEN=LOCK and so on are also output to the upper control system of the TRX2 on the reception side in addition to the TRX1 on the transmission side.

Configuring the TRX2 as described above allows the frequency locking detection block 25 to detect the frequency locking of free-running oscillation frequency f2 of local oscillation signal Sl of the oscillator 23 with carrier frequency f1 of injected reception signal Sin1. If this frequency locking is found, the transmission section 22 is ready for transmitting enable signal SEN generated by the frequency locking detection block 25 to the TRX1 on the transmission side.

Figure 3:
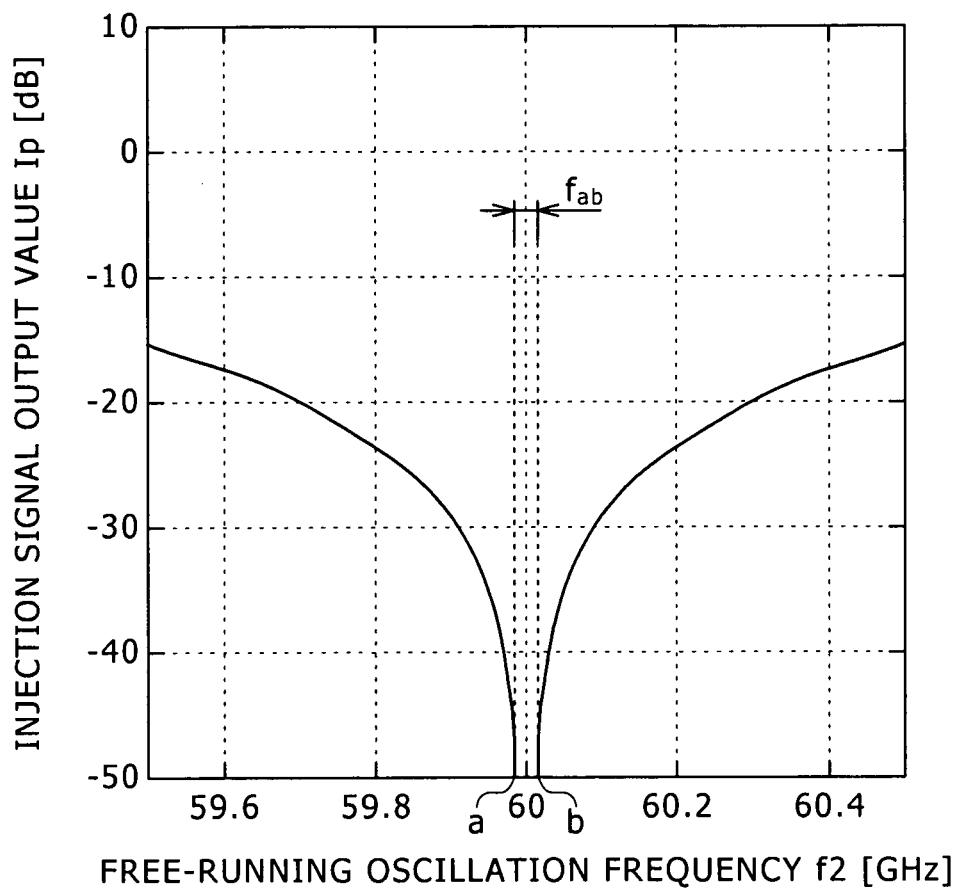
FIG. 3 is a graph indicative of an exemplary relation between injection signal output value and free-running oscillation frequency.

The following describes an exemplary relation between injected signal output value Ip and free-running oscillation frequency f2 with reference to FIG. 3. The vertical axis shown in FIG. 3 is representative of injected signal output value Ip(dB). Injected signal output value Ip denotes an intensity value of a beat signal that is obtained by injecting reference carrier signal Sr having unmodulated carrier frequency f1 into the oscillator 23 of the TRX2 as reception signal Sin1 and entering reception signal Sin1 into the down-conversion mixer 203.

The beat signal denotes a signal indicative of a difference between reception signal Sin1 having carrier frequency f1 obtained from the down-conversion mixer 203 and local oscillation signal Sl having free-running oscillation frequency f2 of the oscillator 23. The horizontal axis is representative of free-running oscillation frequency f2 of the oscillator 23. For example, in the figure, free-running oscillation frequency f2 is 59.6 GHz to 60.4 GHz, the scale being in unit of 0.2 GHz.

In this example, the relation between injected signal output value Ip and free-running oscillation frequency f2 is indicated by mostly V-shaped characteristics curves. The characteristics curves are given by equation (1) below, namely:

$$Ip(dB) = 20 \cdot \log 10\{(2 \cdot \alpha \cdot Q \cdot abs(f2-finj))/finj\} \quad (1)$$

where, f2 is free-running oscillation frequency of the oscillator 23, α is an amplitude of local oscillation signal Sl having free-running oscillation frequency f2, Q (Quality factor) is a peak value of a tank circuit of the oscillator 23, and finj is the center frequency of the oscillator 23 at the time of injection locking. In the graph, fab denotes the frequency range of injection locking. In the figure, fa of point a is representative of the lower-limit frequency while fb of point b is representative of the upper-limit frequency. Frequency range fab is given by equation (2) below, namely:

$$fab = 1/2\pi \cdot (\omega inj \pm \Delta\omega m)$$

$$\Delta\omega m = \rho \cdot \omega 0 / 2\alpha Q \quad (2)$$

where center frequency finj of the oscillator 23 is replaced by ωinj, free-running oscillation frequency f2 is replaced by ω0, and the amplitude of reception signal Sin1 (injection signal) is ρ. Δωm is representative of a frequency variation that is controlled by the control block 24 within frequency range fab of injection locking.

The control block 24 controls free-running oscillation frequency f2 of the oscillator 23 to vary free-running oscillation frequency f2, thereby locking center frequency winj of frequency range fab of this injection locking with carrier frequency f1 of reception signal Sin1.

In this example, the output of the down-conversion mixer 203 in which unmodulated reception signal Sin1 has been entered is a beat signal. This beat signal has injection signal output value Ip (dB) that is the intensity indicated by an almost quadratic curves if free-running oscillation frequency f2 of local oscillation signal Sl of the oscillator 23 is outside the frequency range of carrier frequency f1 of unmodulated reception signal Sin1. Further, the beat signal is a direct current having no injection signal output value Ip (dB) if free-running oscillation frequency f2 is inside frequency range fab of carrier frequency f1. In this example, frequency range fab at the time of injection locking in the oscillator 23 is 60 GHz+/−0.02 GHz.

Figure 4A:
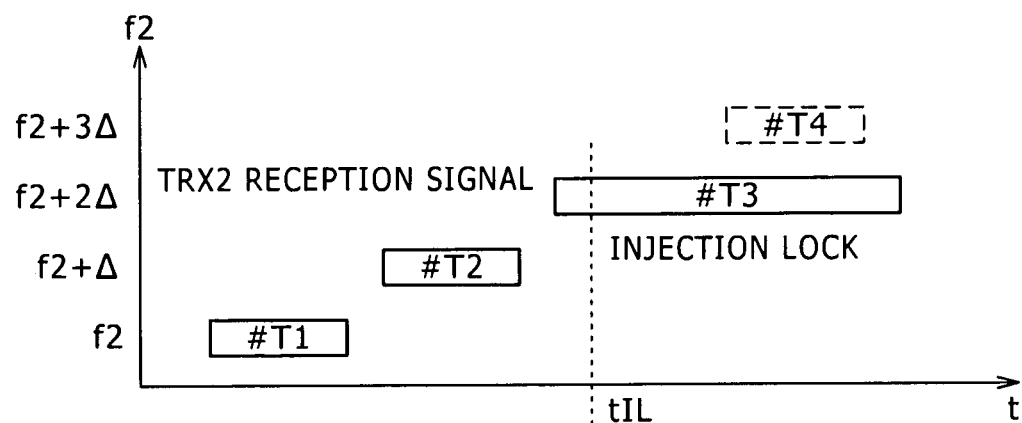
FIGS. 4A and 4B are graphs indicative of examples of control on free-running oscillation frequency in the control block.
Figure 4B:
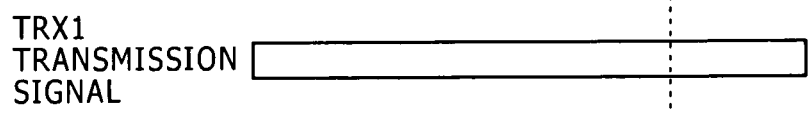

The following describes a control example of free-running oscillation frequency f2 with reference to FIGS. 4A and 4B. The vertical axis shown in FIG. 4A is representative of free-running oscillation frequency f2 of the oscillator 23. The horizontal axis is representative of time t at which injection locking is executed. In the figure, TRX2 reception signal is reception signal Sin1 received from the TRX1. tIL is representative of a time up to frequency locking (injection locking). The TRX1 transmission signal shown in FIG. 4B is transmission signal Sout1 to be transmitted from the TRX1 to the TRX2 and reception signal Sin1 to be received by the TRX2. Reception signal Sin1 is injected in the oscillator 23 as an injection signal.

In this example, the control block 24 sets free-running oscillation frequency f2 to the oscillator 23 in injection locking control period #T1. Likewise, the control block 24 sets free-running oscillation frequency f2=f2+Δ to the oscillator 23 in injection locking control period #T2. The control block 24 sets free-running oscillation frequency f2=f2+2Δ to the oscillator 23 in injection locking control period #T3. In this example, the oscillator 23 reaches the frequency locking at time tIL in injection locking control period #T3. It should be noted that, if frequency locking cannot be obtained, free-running oscillation frequency f2=f2+3Δ is set in injection locking control period #T4 indicated by dashed lines.

The following describes a first bidirectional wireless communication method associated with present invention by way of a wireless communication example in the first bidirectional wireless data transmission system No. 1, with reference to FIGS. 5A and 5B. In this embodiment, in the bidirectional wireless data transmission system No. 1, the TRX2 is the wireless communication apparatus on the reception side and the TRX1 is the wireless communication apparatus on the transmission side. Free-running oscillation frequency f2 of local oscillation signal Sl of the oscillator 23 gets in the frequency range up to injection locking to be frequency-locked with carrier frequency f1 of injected reception signal Sin1. If this frequency locking is detected by the frequency locking detection block 25, it is assumed that the TRX2 transmit enable signal SEN to the TRX1.

Under the above-mentioned wireless communication conditions at the time of injection locking, the TRX2 gets, in step P21 shown in FIG. 5B, into a reception state upon turning on of the up-counter 41 by the control block 24 shown in FIG. 2A. At this moment, the control block 24 shown in FIG. 2A controls free-running oscillation frequency f2 of the oscillator 23. For example, let the injection locking control period shown in FIGS. 5A and 5B be T and the injection locking control period shown in FIGS. 4A and 4B be T=#T1, then free-running oscillation frequency f2 is set to the oscillator 23 by injection locking control period T=#T1.

On one hand, in the TRX1, the transmission section 11 starts transmission in step P11. Next, in step P12, the TRX1 transmits transmission signal Sout1 having unmodulated carrier frequency f1 to the TRX2 to execute request to connect processing. At this moment, the TRX1 transmits, as transmission signal Sout1, reference carrier signal Sr having predetermined unmodulated carrier frequency f1 without modulating data DIN1. Transmission signal Sout1 is radiated to the TRX2 via the transmission antenna 106.

On the other hand, in step P22, the reception section 21 of the TRX2 starts receiving reception signal Sin1. At this moment, the TRX2 injects reception signal Sin1 having carrier frequency f1 received from the TRX1 into the oscillator 23 and receives reception signal Sin1 while variably controlling free-running oscillation frequency f2 of the oscillator 23. Also, reception signal Sin1 is entered in the down-conversion mixer 203 to be down-converted into baseband signal SOUT1. If transmission signal Sout1 (=reception signal Sin1) transmitted from the TRX1 is unmodulated, a beat signal having a frequency that is a difference between carrier frequency f1 and free-running oscillation frequency f2 is output from the down-conversion mixer 203. This beat signal is entered in the frequency locking detection block 25.

Next, in step P23, the frequency locking detection block 25 determines whether the oscillator 23 has been frequency-locked (injection-locked) by injection locking. At this moment, in the frequency locking detection block 25, the frequency discriminator 51 converts a frequency variation of baseband signal SOUT1 obtained by demodulating reception signal Sin1 into an amplitude value. The amplitude value after frequency discrimination is output to the comparator 52. The comparator 52 compares the amplitude value obtained from the frequency discriminator 51 with a preset comparison reference value to determine whether free-running oscillation frequency f2 of the oscillator 23 has entered the frequency range up to injection locking to be frequency-locked with carrier frequency f1 of injected reception signal Sin1. The comparison reference value is given by threshold voltage Vth output from the upper control system. If there is a mismatch between the amplitude value obtained from the frequency discriminator 51 and the preset comparison reference value, the comparator 52 outputs enable signal SEN=inverted LOCK (the upper line omitted here) to the control block 24.

In step P24, the control block 24 drives the up-counter 41. In step P25, the control block 24 sets free-running oscillation frequency f2=f2+Δ to the oscillator 23. The oscillator 23 oscillates at free-running oscillation frequency f2=f2+Δ during injection locking control period T=#2. If the oscillator 23 has not reached frequency locking during injection locking control period T=#T2, the control block 24 drives the up-counter 41 again in step P24.

In step P25, the control block 24 sets free-running oscillation frequency f2=f2+2Δ to the oscillator 23. The oscillator 23 oscillates at free-running oscillation frequency f2=f2+2Δ during injection locking control period T=#T3. The control block 24 repeats the setting for the oscillator 23 to reach the frequency locking.

If carrier frequency f1 has entered frequency range fab of injection locking in step P25 mentioned above, the oscillator 23 is frequency-locked with reference carrier signal Sr. When the oscillator 23 has reached frequency locking, the output from the down-conversion mixer 203 becomes direct current. When the oscillator 23 has reached frequency locking, the amplitude value obtained from the frequency discriminator 51 matches the preset comparison reference value, so that the comparator 52 outputs enable signal SEN=LOCK indicative of the completion of injection locking. Enable signal SEN is entered in the control block 24 to fix free-running oscillation frequency f2 of the oscillator 23. Center frequency ω0 of free-running oscillation frequency f2 at this moment is generated by the oscillator 23. Enable signals SEN=LOCK and so on are also output to the upper control system of the TRX2 on the reception side in addition to the TRX1 on the transmission side.

If the oscillator 23 has reached frequency locking, then the transmission section 22 turns on the modulation block 206 by use of enable signal SEN as a trigger in step P26. The modulation block 206 outputs modulated signal SIN2 obtained by modulating enable signal SEN to the up-conversion mixer 208 via the baseband amplifier 207. The up-conversion mixer 208 up-converts modulated signal SIN2 containing enable signal SEN on the basis of carrier signal Sr' having carrier frequency fr' and outputs resultant Sout2. Carrier signal Sr' is a frequency obtained by multiplying fixed free-running oscillation frequency f2 by 2.

Next, in step P27, transmission signal Sout2 having carrier frequency fr' is transmitted from the TRX2 to the TRX1 to execute connection acknowledge processing. At this moment, the transmission signal Sout2 is radiated to the TRX1 via the power amplifier 210 and the transmission antenna 211. The reception antenna 107 of the TRX1 receives transmission signal Sout2 and outputs reception signal Sin2 containing enable signal SEN.

Receiving reception signal Sin2 containing enable signal SEN in step P13, the TRX1 becomes ready for identifying (or recognizing) that frequency locking has been achieved between the TRX1 and the TRX2 and the TRX1 can enter a communication state. Then, in step P14, the TRX1 start communication of data DIN1 and so on. The TRX1 fixes carrier frequency f1 to enter communication state. The TRX1 modulates data DIN1 and up-converts modulated signal SIN1 containing modulated data DIN1 by reference carrier signal Sr having carrier frequency f1, thereby transmitting up-converted transmission signal Sout1 to the TRX2.

The reception antenna 201 of the TRX2 receives transmission signal Sout1 containing data DIN1 and outputs reception signal Sin1 to the reception section 21. The reception section 21 receives reception signal Sin1 and demodulates reception signal Sin1 in step P28, thereby reconstructing data DOUT1. It should be noted that, in the case of a system having two or more channels, the processing between TA and TB is repeated in step P29.

As described above, according to the bidirectional wireless data transmission system No. 1 as the first embodiment, the TRX1 multiplexes modulated signal SIN1 obtained by modulating data DIN1 with reference carrier signal Sr having predetermined carrier frequency f1, thereby transmitting resultant transmission signal Sout1. The TRX2 injects reception signal Sin1 received from the TRX1 into the oscillator 23 and, at the same time, receives reception signal Sin1 while variably controlling free-running oscillation frequency f2 of the oscillator 23.

The TRX2 detects that free-running oscillation frequency f2 of the oscillator 23 has entered the frequency range up to injection locking to be locked with carrier frequency f1 of injected reception signal Sin1, thereby generating enable signal SEN. If free-running oscillation frequency f2 of the oscillator 23 is found frequency-locked with carrier frequency f1 of injected reception signal Sin1, the TRX2 transmits enable signal SEN to the TRX1.

Therefore, the TRX1 becomes ready for detecting (or recognizing) that the frequency locking with the TRX2 has been completed on the basis of enable signal SEN and the TRX1 is in a communication enabled state. Consequently, transmitting data DIN1 and so on from the TRX1 to the TRX2 after frequency locking allows the TRX2 to reconstruct data DOUT1 on the basis of the signal of free-running oscillation frequency f2 after frequency locking.

Further, the oscillator 13 is sharably used between the transmission section 11 and the reception section 12 in the TRX1 and the oscillator 23 is sharably used between the reception section 21 and the transmission section 22 in the TRX2. This sharing can realize that, upon achieving of frequency locking by injection locking in the down-link signal transmission system, frequency locking is automatically achieved also in the up-link signal transmission channel in the reserve direction. Consequently, when data transmission is executed in the up-link signal transmission system, signal processing can be realized in a frequency-locked state.

Besides, as compared with a circuit that contains a PLL circuit, the frequency locking circuit can be configured with a simpler circuit. In addition, if a free-running local oscillator in which free-running oscillation frequency f2 has errors is used for the oscillator 23, the oscillation frequency of one side can be received by varying the oscillation frequency by the control block 24, thereby driving locking into the injection locking range. It should be noted that a down-counter may be used for the control block 24 instead of the up-counter 41. Obviously, the control block 24 may be configured by use of both the up-counter 41 and the down-counter.

The Second Embodiment

Figure 6:
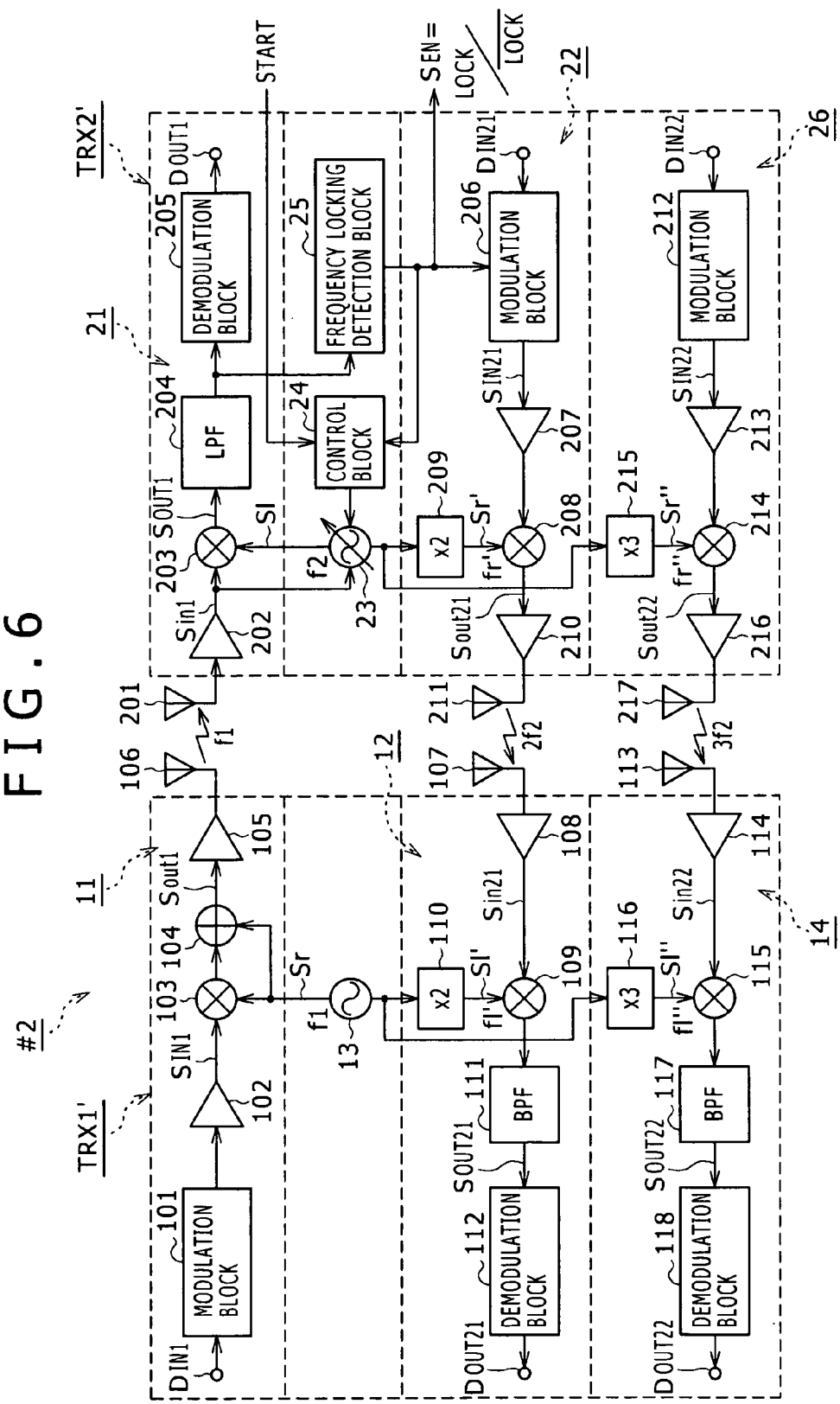
FIG. 6 is a block diagram illustrating an exemplary configuration of a bidirectional wireless data transmission system No. 2 practiced as a second embodiment of the invention.

The following describes an exemplary configuration of a bidirectional wireless data transmission system No. 2 practiced as a second embodiment of the invention with reference to FIG. 6. In the second embodiment, a TRX2' has two or more different, two in this example, transmission sections 22 and 26. Two uplink signal transmission channels are configured from the TRX2' to the TRX1'. Carrier frequencies fr' and fr" of the two uplink signal transmission channels are each generated by a single oscillator 23 and on the basis of free-running oscillation frequency f2. The TRX1' has two reception sections 12 and 14.

Frequency relations between the transmission section 11 and the reception sections 12 and 14 in the TRX1' are set to M/N (M and N are integers). Frequency relations between the reception section 21 and the transmission sections 22 and 26 in the TRX2' are set to M/N (M and N are integers). As shown in FIGS. 5A and 5B, in the bidirectional wireless data transmission system No. 2, the frequency locking based on injection locking between the TRX1' and TRX2' matches free-running oscillation frequency f2 with carrier frequency f1. By use of this matching between free-running oscillation frequency f2 and the carrier frequency f1, an operation for placing frequency locking between two or more channels is realized. This configuration allows the simultaneous realization of the frequency locking of all uplink signal transmission channels.

The TRX2' shown in FIG. 6 configures one example of the second wireless communication apparatus and is composed of a reception section 21, a first transmission section 22, an oscillator 23, a control block 24, a frequency locking detection block 25, a second transmission section 26, a reception antenna 201, and transmission antennas 211 and 217. The transmission section 22 configures the first uplink transmission channel. With reference to FIG. 6, components similar to those previously described with reference to the first embodiment are denoted by the same reference characters and the description thereof will be skipped.

The second transmission section 26 configures the second uplink signal transmission channel. As described before with reference to FIGS. 5A and 5B, the frequency locking detection-block 25 detects that free-running oscillation frequency f2 has entered the frequency range up to injection locking to be frequency-locked with carrier frequency f1 of injected reception signal Sin1. Then, after this injection locking, data DIN22 is transmitted to the TRX1'. The second transmission section 26 is composed of a modulation block 212, a baseband amplifier 213, an up-conversion mixer 214, a frequency multiplier 215, and a power amplifier 216.

The modulation block 212 receives data DIN22 and modulates this data DIN22, outputting modulated signal SIN22. The modulation block 212 is connected with the baseband amplifier 213. The baseband amplifier 213 amplifies modulated signal SIN22. The baseband amplifier 213 is connected with the up-conversion mixer 214. The up-conversion mixer 214 and the oscillator 23 described before are connected with the frequency multiplier 215. The frequency multiplier 215 outputs carrier frequency fr"=3·f2 obtained by multiplying free-running oscillation frequency f2 by 3 to the up-conversion mixer 214.

The up-conversion mixer 214 up-converts (multiplication processing for frequency conversion) amplified modulated signal SIN22 and carrier signal Sr" having carrier frequency fr" to output transmission signal Sout22. The up-conversion mixer 214 is connected with the power amplifier 216. The power amplifier 216 amplifies up-converted transmission signal Sout22 and outputs amplified transmission signal Sout22 to the antenna 217.

The antenna 217 receives transmission signal Sout22 and radiates the received signal in the form of electromagnetic waves. Consequently, the transmission section 22 becomes ready for transmit transmission signal Sout22 obtained by multiplexing modulated signal SIN22 after injection locking with carrier signal Sr" having predetermined carrier frequency fr" to the communication mate TRX1'. It should be noted that, for the transmission section 22, data DIN2, modulated signal SIN2, transmission signal Sout2, and so on shown in FIG. 1 should be replaced by data DIN21, modulated signal SIN21, transmission signal Sout21, and so on, respectively.

In carrier frequency f1 in the transmission section 11 of the TRX1' and carrier frequency fr" in the second transmission section 26 of the TRX2, relation M/N is set between carrier frequency f1 of the TRX1' and carrier frequency fr"=3·f1 of the TRX2', where M and N are integers. For example, if carrier frequency f1 in the TRX1' is set to 60 GHz, carrier frequency fr" in the TRX2' is set to 180 GHz. In this example, f1:fr"=60:180=M:N (1:3).

Obviously, carrier signal Sr" obtained by dividing local oscillation signal Sl having free-running oscillation frequency f2 may be used. For example, if carrier frequency f1 in the TRX1' is set to 60 GHz, carrier frequency fr" in the TRX2' is set to 20 GHz. In this example, f1:fr"=60:20=M:N (3:1).

The TRX1' configures one example of the first wireless communication apparatus and is composed of a transmission section 11, an oscillator 13, a first reception section 12, a second reception section 14, a transmission antenna 106, and reception antennas 107 and 113. The first reception section 12 configures a first uplink signal transmission channel. With reference to FIG. 6, components similar to those previously described with reference to the first embodiment are denoted by the same reference symbols and the description thereof will be skipped.

The second reception section 14 configures a second uplink signal transmission channel and is composed of a low-noise amplifier 114, a down-conversion mixer 115, a frequency multiplier 116, a bandpass filter 117, and a demodulator 118. The reception antenna 113 is connected with the low-noise amplifier 114. The low-noise amplifier 114 amplifies reception signal Sin22 received by the antenna 113. Reception signal Sin22 contains carrier signal Sr" three times as high as free-running oscillation frequency f2. Reception signal Sin22 contains data DIN22 transmitted from the TRX2' after injection locking.

The low-noise amplifier 114 is connected with the down-conversion mixer 115. The down-conversion mixer 115 is connected with frequency multiplexer 116. The frequency multiplexer 116 is connected with the oscillator 13 to output 3×f1 local oscillation signal Sl" obtained by multiplying carrier frequency f1 by 3 to the down-conversion mixer 115. The down-conversion mixer 115 down-converts (or subtracts) reception signal Sin22 on the basis of local oscillation signal Sl" output from the frequency multiplexer 116 and outputs a subtracted signal.

The down-conversion mixer 115 is connected with the bandpass filter 117. The bandpass filter 117 passes baseband signal SOUT22 containing data DIN22 of the TRX2' after injection locking. The bandpass filter 117 is connected with the demodulator 118. The demodulator 118 demodulates baseband signal SOUT22 and outputs data DOUT22. It should be noted that, for the reception section 12, reception signal Sin2, baseband signal SOUT2, data DOUT1, and so on shown in FIG. 1 should be replaced by reception signal Sin21, baseband signal SOUT21, data DOUT21 and so on, respectively.

Exemplary operations of the bidirectional wireless data transmission system No. 2 described above are as shown in FIGS. 5A and 5B up to the operations to be executed until injection locking is provided between the TRX1' and the TRX2'. Upon injection locking, the first uplink signal transmission channel and the second uplink signal transmission channel independently execute wireless communication processing.

In the first uplink signal transmission channel, receiving data DIN21, the transmission section 22 of the TRX2' outputs modulated signal SIN21 obtained by modulated data DIN21 via the baseband amplifier 207 to the up conversion mixer 208. The up-conversion mixer 208 up-converts modulated signal SIN21 containing data DIN21 on the basis of carrier signal Sr' having carrier frequency fr' and outputs resultant transmission signal Sout21. Carrier frequency Sr' is a frequency obtained by multiplying free-running oscillation frequency f2 by 2 in the frequency multiplier 209.

Transmission signal Sout21 having carrier frequency fr' is transmitted from the TRX2' to the TRX1'. At this moment, transmission signal Sout21 is radiated to the TRX1' via the power amplifier 210 and the transmission antenna 211. The reception antenna 107 of the TRX1' receives transmission signal Sout21 and outputs reception signal Sin21 containing data DIN21. Receiving reception signal Sin21 containing data DIN21, the TRX1' demodulates reception signal Sin21, thereby reconstructing data DOUT21.

For the second uplink signal transmission channel, the second transmission section 26 outputs modulated signal SIN22 obtained by modulating data DIN22 to the up-conversion mixer 214 via the baseband amplifier 213. The up-conversion mixer 214 up-converts modulated signal SIN22 containing data DIN22 on the basis of carrier signal Sr" having carrier frequency fr" and outputs resultant transmission signal Sout22. Carrier signal Sr" is a frequency obtained by multiplying free-running oscillation frequency f2 by 3 in the frequency multiplier 215.

Transmission signal Sout22 of the carrier frequency fr" is transmitted from the TRX2' to the TRX1'. At this moment, transmission signal Sout22 is radiated to the TRX1' via the power amplifier 216 and the antenna 217. The antenna 113 of the TRX1' receives transmission signal Sout22 and radiates reception signal Sin22 containing data DIN22. Receiving reception signal Sin22 containing data DIN22, the TRX1' demodulates reception signal Sin22, thereby reconstructing data DOUT22.

As described above, according to the bidirectional wireless data transmission system No. 2 practiced as the second embodiment of the invention, the TRX2' has two transmission sections 22 and 26 having two different carrier frequencies fr' and fr" like carrier frequencies fr' and fr" relative to free-running oscillation frequency f2. Two systems of uplink signal transmission channels are configured from the TRX2' to the TRX1'. Carrier frequencies fr' and fr" of these uplink signal transmission channels are generated by the single oscillator 23. The TRX1' has two reception sections 12 and 14.

Frequency relation between the transmission section 11 and the reception sections 12 and 14 in the TRX1' is set to relation M/N (M=3, N=1) like 120 GHz and 180 GHz relative to carrier frequency f1=60 GHz. Frequency relation between the reception section 21 and the transmission sections 22 and 26 in the TRX2' is set to relation M/N (M=2, N=1) like 120 GHz and relation M/N (M=3, N=1) like 180 GHz relative to free-running oscillation frequency f2=60 GHz.

Consequently, free-running oscillation frequency f2 comes to match carrier frequency f1 by the injection locking between the TRX1' and the TRX2', thereby realizing an operator for providing frequency locking between the other two uplink signal transmission channels by use of free-running oscillation frequency f2 after injection locking. This allows wireless communication processing by simultaneous use of two systems of uplink signal transmission channels after injection locking.

In addition, the oscillator 13 is sharably used between the transmission section 11 and the reception sections 12 and 14 in the TRX1' and the oscillator 23 is sharably used between the reception section 21 and the transmission sections 22 and 26 in the TRX2'. This sharing can easily realize automatic frequency locking between the two uplink signal transmission channels in the reverse direction upon the establishment of injection locking.

The Third Embodiment

Figure 7:
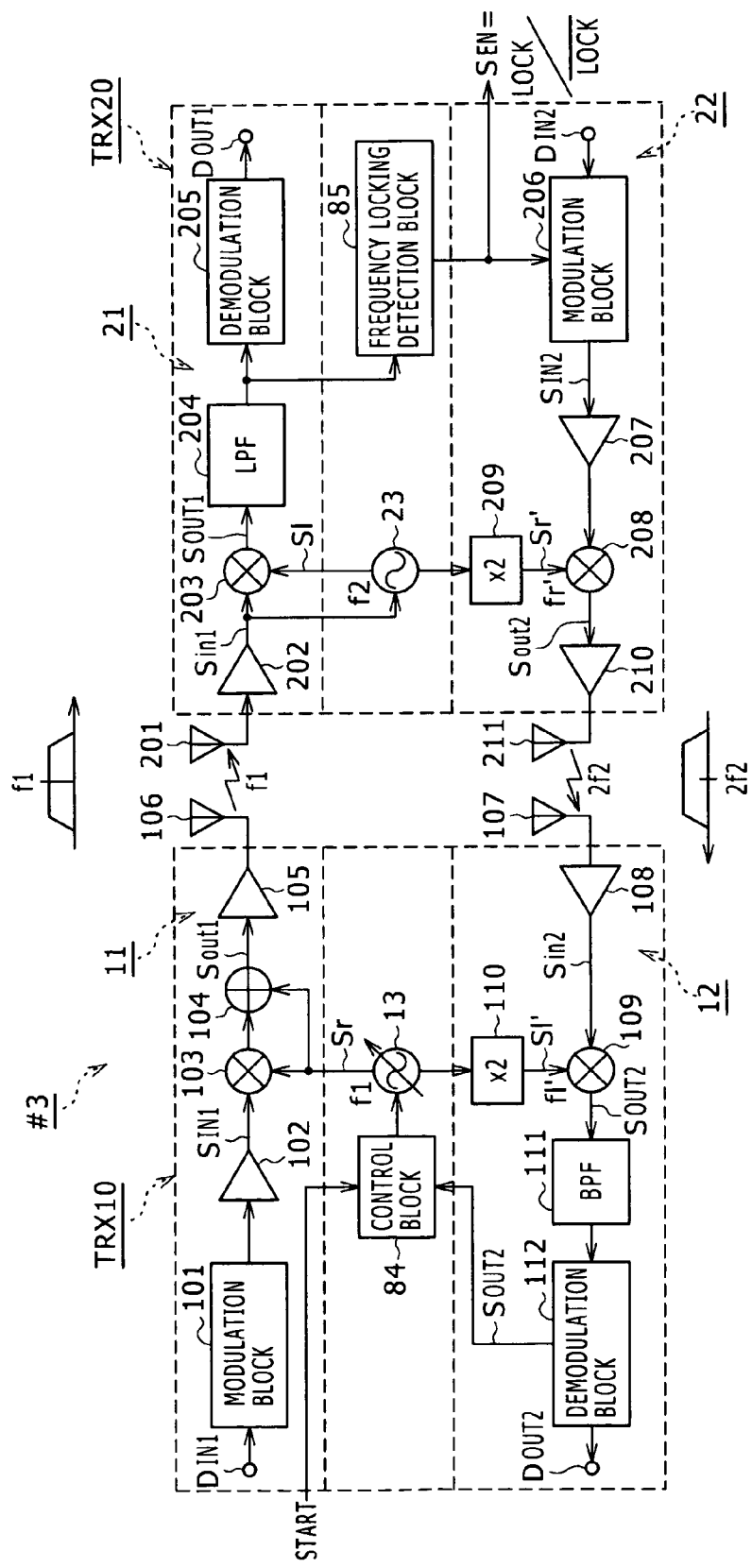
FIG. 7 is a block diagram illustrating an exemplary configuration of a bidirectional wireless data transmission system No. 3 practiced as a third embodiment of the invention.

The following describes an exemplary configuration of a bidirectional wireless data transmission system No. 3 practiced as a third embodiment of the invention with reference to FIG. 7. In the third embodiment, the control block 24 described with reference to the first embodiment is arranged as a control block 84 in a TRX10. The control block 84 multiplexes modulated signal SIN1 obtained by modulating data DIN1 by reference carrier signal Sr having predetermined carrier frequency f1 and transmits resultant transmission signal Sout1. In this transmission, the control block 84 transmits transmission signal Sout1 while variably controlling carrier frequency f1 of reference carrier signal Sr on the side of the TRX10.

The bidirectional wireless data transmission system No. 3 shown in FIG. 7 fast transmits signals in a millimeter band of frequencies 30 GHz to 300 GHz for carrying movie images, computer graphics, and so on between devices arranged in proximity and inside a device. This system is applicable asymmetrical wireless data transmission systems in which different carrier frequencies are used for transmission and reception to realize frequency locking by injection locking.

The bidirectional wireless data transmission system No. 3 has the TRX10 and the TRX20. In this example, the TRX10 configures one example of a third wireless communication apparatus, thereby varying carrier frequency f1 of the oscillator 13. Carrier frequency f1 concerned is captured into frequency range fab of injection locking of free-running oscillation frequency f2 fixed by the oscillator 23 of the TRX20 configuring one example of a fourth wireless communication apparatus. The TRX20 detects the frequency locking and signals in the millimeter band are transmitted and received by use of the detected frequency locking as a trigger. Consequently, bidirectional frequency locking states can be confirmed.

The TRX10 is composed of a transmission section 11, a reception section 12, the oscillator 13, the control block 84, a transmission antenna 106, and a reception antenna 107. The transmission section 11 multiplexes modulated signal SIN1 obtained by modulated data DIN1 by reference carrier signal Sr having predetermined carrier frequency f1 and transmits resultant transmission signal Sout1 to the TRX20. In this transmission, the TRX10 transmits transmission signal Sout1 while variably controlling carrier frequency f1 of reference carrier signal Sr.

Like the first embodiment, the TRX20 is composed of a reception section 21, a transmission section 22, an oscillator 23, a frequency locking detection block 85, a reception antenna 201, and a transmission antenna 211. The TRX20 has the oscillator 23 that oscillates local oscillation signal Sl having free-running oscillation frequency f2 (fixed). In this example, received reception signal Sin1 is injected in the oscillator 23, but local oscillation signal Sl of the oscillator 23 is fixed. Free-running oscillation frequency f2 of the oscillator 23 is fixed in order to vary carrier frequency f1 on the side of the TRX10.

The frequency locking detection block 85 gets baseband signal SOUT1 obtained after down-conversion processing. For free-running oscillation frequency f2 (fixed) of the oscillator 23, the frequency locking detection block 85 detects whether carrier frequency f1 of injected reception signal Sin1 has entered a frequency range up to injection locking to be matched with free-running oscillation frequency f2 concerned, thereby generating enable signal SEN. In this example, if the frequency locking of carrier frequency f1 of injected reception signal Sin1 with free-running oscillation frequency f2 of the oscillator 23 is found, the TRX20 transmits enable signal SEN to the TRX10.

The reception section 12 of the TRX10 receives enable signal SEN from the TRX20 that has been output upon frequency locking of carrier frequency f1 of injected reception signal Sin1 with free-running oscillation frequency f2 of the oscillator 23 of the TRX 20. With reference to FIG. 7, components similar to those previously described with reference to the first embodiment are denoted by the same reference symbols and the description thereof will be skipped.

Figure 8A:
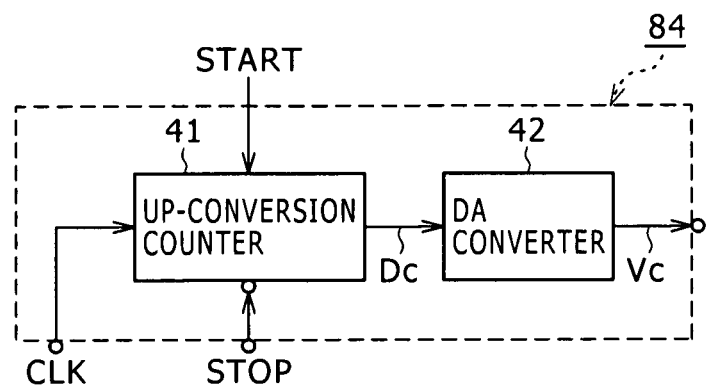
FIGS. 8A and 8B are block diagrams illustrating exemplary internal configurations of a control block and a frequency locking detection block.
Figure 8B:
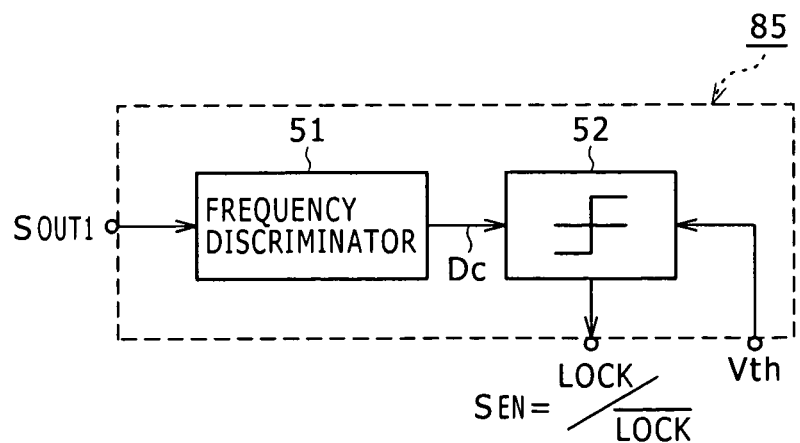
Figure 10:
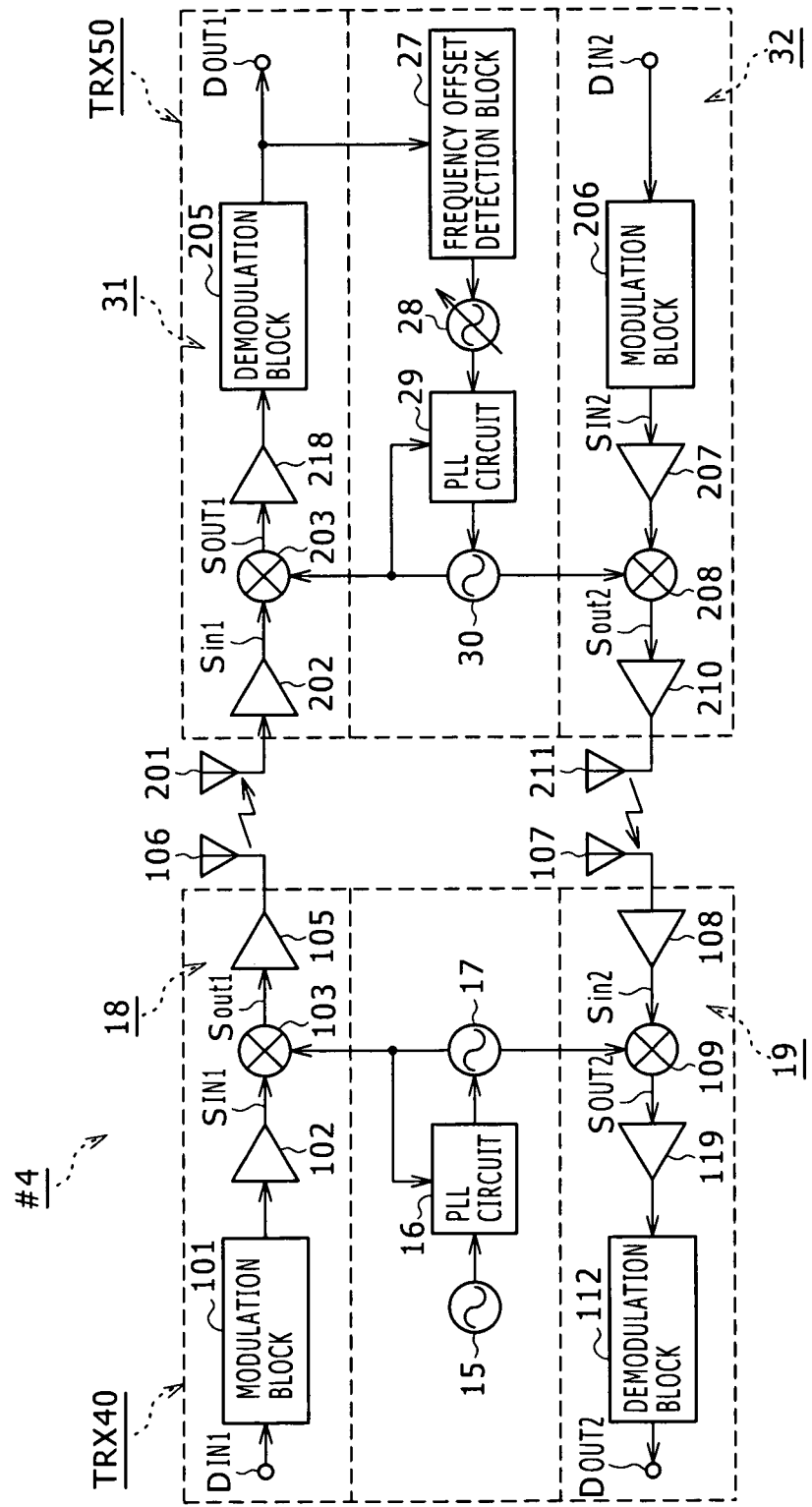
FIG. 10 is a block diagram illustrating an exemplary configuration of a bidirectional wireless data transmission system No. 4 related to a related art example.

The following describes exemplary internal configurations of the control block 84 and the frequency locking detection block 85 with reference to FIGS. 8A and 8B. In order to variably control carrier frequency f1 of the oscillator 13, the control block 84 of the TRX10 is composed of an up-counter 41 and a digital/analog converter (hereafter referred to as a DA converter 42). The up-counter 41 up-counts the number of pulses of clock signal CLK, for example, on the basis of start signal Start, thereby outputting oscillation control data Dc. The up-counter 41 stops outputting oscillation control data Dc on the basis of stop signal Stop. The up-counter 41 is connected with the DA converter 42.

The DA converter 42 digital-to-analog converts oscillation control data Dc to generate analog VCO control voltage Vc. VCO control voltage Vc is output to the oscillator 13 that generates reference carrier signal Sr. If VCO control voltage Vc gets higher than a certain reference voltage, the oscillator 13 decreases carrier frequency f1 of reference carrier signal Sr. If VCO control voltage Vc gets lower than a certain reference voltage, the oscillator 13 increases carrier frequency f1 of reference carrier signal Sr.

The control block 84 repeatedly increases or decreases carrier frequency f1 of the oscillator 13 within a frequency range fab up to injection locking, thereby executing variable tuning. Consequently, the TRX20 can execute, by injection control, frequency-control of free-running oscillation frequency f2 (fixed) of the oscillator 23 in reception signal Sin1 has been injected. Configuring the TRX10 as described above makes carrier frequency f1 of injected reception signal Sin1 get in the frequency range up to injection locking, thereby frequency-locking carrier frequency f1 with free-running oscillation frequency f2 concerned in a remote operation manner. Injected reception signal Sin1 has carrier frequency f1 for free-running oscillation frequency f2 (fixed) of local oscillation signal SL obtained through the oscillator 23.

The exemplary internal configuration of the frequency locking detection block 85 shown in FIG. 8B is substantially the same as that of the frequency locking detection block 85 shown in FIG. 2B, so that the description thereof will be skipped. In this example, the control block 84 of the TRX10 variably controls carrier frequency f1 of reference carrier signal Sr of the oscillator 13. Reference carrier signal Sr having carrier frequency f1 to be variably controlled is injected in the oscillator 23 in the TRX20. The TRX20 determines whether carrier frequency f1 of injected reception signal Sin1 has been frequency-locked with free-running oscillation frequency f2 (fixed) of the oscillator 23, thereby generating enable signal SEN. This enable signal SEN is as described before with reference to the first embodiment of the invention.

Configuring the TRX20 as described above allows the frequency locking of free-running oscillation frequency f2 (fixed) of the oscillator 23 with carrier frequency f1 of injected reception signal Sin1 if carrier frequency f1 is varied in the TRX10. If this frequency locking is detected by the frequency locking detection block 85, the transmission section 22 can transmit enable signal SEN generated by the frequency locking detection block 85 to the TRX10 on the transmission side.

The following describes exemplary wireless communication to be executed in the third bidirectional wireless data transmission system No. 3 with reference to FIGS. 9A and 9B. In this third embodiment, when frequency locking based on injection locking is controlled, transmission signal Sout1 is transmitted while variably controlling carrier frequency f1 of reference carrier signal Sr. The TRX20 injects reception signal Sin1 received from the TRX10 into the oscillator 23. AT this moment, it is a premise that the TRX20 determines whether carrier frequency f1 of injected reception signal Sin1 has been frequency-locked with free-running oscillation frequency f2 (fixed) of the oscillator 23, thereby generating enable signal SEN.

Using these conditions as wireless communication conditions as described above at the time of injection locking, the control block 84 shown in FIG. 8A turns on the up-counter 41, upon which the TRX10 gets in a reception state in step P31 shown in FIG. 9A. At this moment, the control block 84 shown in FIG. 8A controls carrier frequency f1 of the oscillator 13. For example, let injection locking control period shown in FIG. 9A be T and injection locking control period shown in FIGS. 4A and 4B be T=#T1, then carrier frequency f1 is set to the oscillator 13 by injection locking control period T=#T1.

On the other hand, in step P41, the reception section 21 start reception in the TRX20. Concurrently, in step P32, the transmission section 11 of the TRX10 starts transmitting transmission signal Sout1. In step P33, the TRX10 transmits transmission signal Sout1 having unmodulated carrier frequency f1 to the TRX20, thereby executing request to connect processing. At this moment, the TRX10 transmits, as transmission signal Sout1, reference carrier signal Sr having predetermined unmodulated carrier frequency f1 obtained from data DIN1 without modulation. Transmission signal Sout1 is radiated to the TRX20 via the transmission antenna 106.

In step P42, the reception section 21 of the TRX20 receives reception signal Sin1. At this moment, the TRX20 injects reception signal Sin1 having carrier frequency f1 received from the TRX10 into the oscillator 23 and fixes free-running oscillation frequency f2 of the oscillator 23 to receive reception signal Sin1. Also, reception signal Sin1 is entered in the down-conversion mixer 203 to be down-converted, thereby being frequency-converted into baseband signal SOUT1. If transmission signal Sout1 (=reception signal Sin1) from the TRX10 is unmodulated, a beat signal having a frequency that is a difference between carrier frequency f1 and free-running oscillation frequency f2 is output from the down-conversion mixer 203. This beat signal is entered in the frequency locking detection block 85.

Next, in step P43, the frequency locking detection block 85 determines whether the oscillator 23 has been frequency-locked (or injection-locked) due to injection locking. At this moment, in the frequency locking detection block 85, a frequency discriminator 51 converts a frequency variation of baseband signal SOUT1 obtained by demodulating reception signal Sin1 into an amplitude value. The amplitude value after frequency discrimination is output to a comparator 52.

The comparator 52 compares the amplitude value obtained by the frequency discriminator 51 with a preset comparison reference value to determine whether carrier frequency f1 of injected reception signal Sin1 has been frequency-locked with free-running oscillation frequency f2 (fixed) of the oscillator 23. The comparison reference value is given by threshold voltage Vth output from the upper control system. If there is a mismatch between the amplitude value obtained from the frequency discriminator 51 and the comparison reference value, the comparator 52 outputs enable signal SEN=inverted LOCK (the upperline omitted) indicative incompletion of injection locking to the upper control system.

In step P34, the control block 84 drives the up-counter 41. In step P35, the control block 84 sets free-running oscillation frequency f2=f2+Δ to the oscillator 23. The oscillator 23 oscillates at free-running oscillation frequency f2=f2+Δ during injection locking control period T=#T2. If the oscillator 23 has not reached frequency locking during injection locking control period T=#T2, the control block 84 drives the up-counter 41 again in step P34.

In step P35, the control block 84 sets free-running oscillation frequency f2=f2+2Δ to the oscillator 23. The oscillator 23 oscillates at free-running oscillation frequency f2=f2+2Δ during injection locking control period T=#T3. The control block 84 repeats the setting for the oscillator 23 to reach frequency locking.

When carrier frequency f1 gets in frequency range fab of injection locking in step P35 above, the oscillator 23 frequency-locks with reference carrier signal Sr. When the oscillator 23 has reached frequency locking, the output from the down-conversion mixer 203 becomes direct current. When the oscillator 23 has reached frequency locking, the amplitude value obtained from the frequency discriminator 51 matches the preset comparison reference value, so that the comparator 52 outputs enable signal SEN=LOCK indicative of completion of injection locking. Enable signal SEN is entered in the control block 84 of the TRX10 to fix carrier frequency f1 of the oscillator 13. Center frequency ω0 of carrier frequency f1 at this moment is generated by the oscillator 13. Enable signals SEN=LOCK and so on are also output to the upper control system of the TRX20 on the reception side in addition to the TRX10 on the transmission side.

When the oscillator 23 has reached frequency locking, the transmission section 22 turns on the modulation block 206 by use of enable signal SEN as a trigger in step P44. The modulation block 206 outputs modulated signal SIN2 obtained by modulating enable signal SEN to the up-conversion mixer 208 via the baseband amplifier 207. The up-conversion mixer 208 up-converts modulated signal SIN2 containing enable signal SEN on the basis of carrier signal Sr' having carrier frequency fr' and outputs resultant transmission signal Sout2. Carrier signal Sr' has a frequency obtained by multiplying free-running oscillation frequency f2 by 2 in the frequency multiplier 209.

Next, in step P45, transmission signal Sout2 having carrier frequency fr' is transmitted from the TRX20 to the TRX10 to execute connection acknowledge. At this moment, transmission signal Sout2 is radiated to the TRX10 via the power amplifier 210 and the transmission antenna 211. The reception antenna 107 of the TRX10 receives transmission signal Sout2 and outputs reception signal Sin2 that contains enable signal SEN.

Receiving reception signal Sin2 containing enable signal SEN in step S36, the TRX10 can identify (or recognize) that frequency locking has been established between the TRX10 and the TRX20 and enter a communication state thereafter. Next, communication of data DIN1 and so on is started in step P37 in the TRX10. The TRX10 fixes carrier frequency f1 and enters the communication state. The TRX10 modulates data DIN1, up-converts modulated signal SIN1 containing modulated data DIN1 by reference carrier signal Sr having carrier frequency f1, and transmits up-converted transmission signal Sout1 to the TRX20.

The reception antenna 201 of the TRX20 receives transmission signal Sout1 containing data DIN1 and outputs reception signal Sin1 to the reception section 21. The reception section 21 receives reception signal Sin1 and demodulates reception signal Sin1 in step P46, thereby reconstructing data DOUT1.

As described above and according to the third bidirectional wireless data transmission system No. 3, the TRX10 multiplexes modulated signal SIN1 obtained by modulating data DIN1 by reference carrier signal Sr having predetermined carrier signal f1 and transmits resultant transmission signal Sout1. In this transmission, the TRX10 transmits transmission signal Sout1 while variably controlling carrier frequency f1 of reference carrier signal Sr.

The TRX20 injects reception signal Sin1 received from the TRX10 into the oscillator 23. At the same time, the TRX20 detects whether carrier frequency f1 of injected reception signal Sin1 has entered the frequency range up to injection locking to be frequency-locked with self-running oscillation frequency f2 concerned, thereby generating enable signal SEN. Reception signal Sin1 is variably controlled for free-running oscillation frequency f2 (fixed) of the oscillator 23. If carrier frequency f1 of injected reception signal Sin1 is found frequency-locked with free-running oscillation frequency f2 of the oscillator 23, then the TRX20 transmits enable signal SEN to the TRX10.

Therefore, the TRX10 can detect (or recognize) that frequency locking with the TRX20 has completed on the basis of enable signal SEN and know that TRX10 is communicable with the TRX20. Consequently, when data DIN1 is transmitted from the TRX10 to the TRX20 after frequency locking, the TRX20 can reconstruct data DOUT1 on the basis of the signal of free-running oscillation frequency f2 after frequency locking. Besides, as compared with the circuit including a PLL circuit, the present frequency locking circuit according to the present embodiment can be configured with a simpler circuit.

In addition, if a free-running local oscillator in which free-running oscillation frequency f2 has errors is used for the oscillator 23, the oscillation frequency of one side can be transmitted by varying the oscillation frequency by the control block 84, thereby driving locking into the injection locking range.

Further, returning enable signal SEN (or a message) indicative of the establishment of frequency locking by injection locking from the TRX20 to the TRX10 allows both the TRX20 and the TRX10 to recognize the establishment of frequency locking, thereby shifting to a bidirectional communication state.

In the TRX10, the oscillator 13 is sharably used between the transmission section 11 and the reception section 12. In the TRX20, the oscillator 23 is sharably used between the reception section 21 and the transmission section 22. This sharing can also easily realize automatic frequency locking of the uplink signal transmission channel in the reverse direction upon the establishment of injection locking.

As described above, embodiments of the present invention are very suitably applicable to wireless data transmission systems configured to fast transmit signals of millimeter band of which carrier frequency f1 for carrying movie images, computer graphics, and so on ranges from 30 GHz to 300 GHz. These wireless data transmission systems include digital recording/reproducing apparatuses, terrestrial-wave television receivers, mobile telephones, game machines, computers, and communications apparatuses, for example.

The present application contains subject matter related to that disclosed in Japanese Priority Patent Application JP 2009-228003 filed in the Japan Patent Office on Sep. 30, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A bidirectional wireless communication system comprising:
    a first wireless communication apparatus configured to multiplex a modulated signal obtained by modulating an input signal by a reference carrier signal having a predetermined carrier frequency, and wirelessly transmit a resultant transmission signal; and
    a second wireless communication apparatus, including:
    a reception section configured to receive the transmission signal wirelessly transmitted by the first wireless communication apparatus and produce therefrom a reception signal,
    a first oscillator configured to produce a signal having a free-running oscillation frequency upon which reception processing is based, where the reception signal is injected into the first oscillator,
    a control unit configured to vary the free-running oscillation frequency of the first oscillator, and
    a frequency locking detection unit configured to detect whether the free-running oscillation frequency of the signal of the first oscillator is in a frequency range in which injection locking with the carrier frequency of the reception signal will occur such that frequency-locking with the carrier frequency of the reception signal results;
    wherein, when the frequency locking detection unit detects that the free-running oscillation frequency of the signal of the first oscillator is in a frequency range in which injection locking with the carrier frequency of the reception signal will occur such that frequency-locking with the carrier frequency of the reception signal results, the second wireless communication apparatus transmits a communication enable signal to the first wireless communication apparatus.

2. The bidirectional wireless communication system according to claim 1, wherein
    the first wireless communication apparatus has a second oscillator that is used by both a reception section and a transmission section of the first wireless communication apparatus,
    the transmission section of the first wireless communication apparatus executes transmission processing on the basis of the reference carrier signal having a predetermined oscillation frequency, which is oscillated by the second oscillator,
    the reception section of the first wireless communication apparatus executes reception processing on the basis of a local oscillator signal obtained by multiplying the reference carrier signal oscillated by the second oscillator,
    the first oscillator is used by both the reception section and a transmission section of the second wireless communication apparatus,
    the reception section of the second wireless communication apparatus executes reception processing on the basis of the free-running oscillation frequency of the first oscillator after injection locking, and
    the transmission section of the second wireless communication apparatus executes transmission processing on the basis of a carrier signal obtained by multiplying the free-running oscillation frequency of the first oscillator after injection locking.

3. The bidirectional wireless communication system according to claim 2, wherein the carrier frequency in the transmission section of the first wireless communication apparatus is related to the carrier frequency in the transmission section of the second wireless communication apparatus by the equation $$f_1 = M/N \cdot f_2,$$

where the carrier frequency in the transmission section of the first wireless communication apparatus is designated by $f_1$, the carrier frequency in the transmission section of the second wireless communication apparatus is designated by $f_2$, and M and N are integers with M≠N.

4. The bidirectional wireless communication system according to claim 1, wherein
    the second wireless communication apparatus includes a plurality of transmission sections,
    the first oscillator is used by both the reception section and the plurality of transmission sections of the second wireless communication apparatus,
    the reception section of the second wireless communication apparatus executes reception processing on the basis of the free-running oscillation frequency of the first oscillator after injection locking,
    the plurality of transmission sections of the second wireless communication apparatus execute transmission processing on the basis of respective carrier signals obtained by multiplying the free-running oscillation frequency of the first oscillator after injection locking by respective amounts, and a plurality of uplink signal transmission channels to the first wireless communication apparatus are configured from the second wireless communication apparatus.

5. The bidirectional wireless communication system according to claim 1, wherein the control unit is configured to, in an injection locking control period:
repeatedly change the free-running oscillation frequency of the first oscillator by a predetermined incremental amount, and
stop changing the free-running oscillation frequency of the first oscillator when the frequency locking detection unit detects that the free-running oscillation frequency of the signal of the oscillator is in a frequency range in which injection locking with the carrier frequency of the reception signal will occur such that frequency-locking with the carrier frequency of the reception signal results.

6. The bidirectional wireless communication system according to claim 1, wherein the frequency locking detection unit includes:
a frequency discriminator configured to convert a frequency variation of a demodulated signal obtained by demodulating the reception signal into an amplitude value and outputting the amplitude value; and
a comparator configured to compare the amplitude value output by the frequency discriminator with a preset comparison reference value to determine whether the free-running oscillation frequency of the signal of the first oscillator is in a frequency range in which injection locking with the carrier frequency of the reception signal will occur such that frequency-locking with the carrier frequency of the reception signal results.

7. A bidirectional wireless communication system comprising:
a first wireless communication apparatus configured to multiplex a modulated signal obtained by modulating an input signal by a reference carrier signal having a predetermined carrier frequency, and wirelessly transmit a resultant transmission signal, the first wireless communication apparatus including:
a first oscillator configured to produce the reference carrier signal having a frequency upon which transmission processing is based, and
a control unit configured to vary the frequency of the first oscillator; and
a second wireless communication apparatus, including:
a reception section configured to receive the transmission signal wirelessly transmitted by the first wireless communication apparatus and produce therefrom a reception signal,
a second oscillator configured to produce a signal having a free-running oscillation frequency upon which reception processing is based, where the reception signal is injected into the second oscillator, and
a frequency locking detection unit configured to detect whether the free-running oscillation frequency of the signal of the second oscillator is in a frequency range in which injection locking with the carrier frequency of the reception signal will occur such that frequency-locking with the carrier frequency of the reception signal results,
wherein, when the frequency locking detection unit detects that the free-running oscillation frequency of the signal of the second oscillator is in a frequency range in which injection locking with the carrier frequency of the reception signal will occur such that frequency-locking with the carrier frequency of the reception signal results, the second wireless communication apparatus transmits a communication enable signal to the first wireless communication apparatus.

8. The bidirectional wireless communication system according to claim 7, wherein the control unit is configured to, in an injection locking control period:
repeatedly change the frequency of the first oscillator by a predetermined incremental amount, and
stop changing the free-running oscillation frequency of the first oscillator when the first wireless communication apparatus receives the enable signal transmitted by the second wireless communication apparatus.

9. A wireless communication apparatus executing wireless communication with another wireless communication apparatus on the transmission side that multiplexes a modulated signal obtained by modulating an input signal by a reference carrier signal having a predetermined carrier frequency, transmits a resultant transmission signal, and receives at least a communication enable signal, comprising:
a reception section configured to receive the transmission signal and produce therefrom a reception signal;
a first oscillator configured to produce a signal having a free-running oscillation frequency upon which reception processing is based, where the reception signal is injected into the first oscillator;
a control unit configured to vary the free-running oscillation frequency of the first oscillator; and
a frequency locking detection unit configured to detect whether the free-running oscillation frequency of the signal of the first oscillator is in a frequency range in which injection locking with the carrier frequency of the reception signal will occur such that frequency-locking with the carrier frequency of the reception signal results,
wherein, when the frequency locking detection unit detects that the free-running oscillation frequency of the signal of the first oscillator is in a frequency range in which injection locking with the carrier frequency of the reception signal will occur such that frequency-locking with the carrier frequency of the reception signal results, the second wireless communication apparatus transmits a communication enable signal.

10. A wireless communication apparatus executing wireless communication with another wireless communication apparatus on the transmission side that transmits a transmission signal resulting from multiplexing a modulated signal obtained by modulating an input signal by a reference carrier signal having a predetermined carrier frequency while variably controlling the carrier frequency of said reference carrier signal and receives at least a communication enable signal, comprising:
a reception section configured to receive the transmission signal and produce therefrom a reception signal;
a first oscillator configured to produce a signal having a free-running oscillation frequency upon which reception processing is based, where the reception signal is injected into the first oscillator; and
a frequency locking detection unit configured to detect whether the free-running oscillation frequency of the signal of the first oscillator is in a frequency range in which injection locking with the carrier frequency of the reception signal will occur such that frequency-locking with the carrier frequency of the reception signal results,
wherein, when the frequency locking detection unit detects that the free-running oscillation frequency of the signal of the first oscillator is in a frequency range in which injection locking with the carrier frequency of the reception signal will occur such that frequency-locking with the carrier frequency of the reception signal results, the second wireless communication apparatus transmits a communication enable signal.

11. A bidirectional wireless communication method comprising:
    causing a first wireless communication apparatus to multiplex a modulated signal obtained by modulating an input signal by a reference carrier signal having a predetermined carrier frequency, and to wirelessly transmit a resultant transmission signal;
    causing a second wireless communication apparatus to receive the transmission signal wirelessly transmitted by the first wireless communication apparatus and produce therefrom a reception signal;
    causing a first oscillator in the second wireless communication apparatus to produce a signal having a free-running oscillation frequency upon which reception processing is based;
    injecting the reception signal into the first oscillator;
    varying the free-running oscillation frequency of the first oscillator;
    detecting whether the free-running oscillation frequency of the signal of the first oscillator is in a frequency range in which injection locking with the carrier frequency of the reception signal will occur such that frequency-locking with the carrier frequency of the reception signal results; and
    when the free-running oscillation frequency of the signal of the first oscillator is in a frequency range in which injection locking with the carrier frequency of the reception signal will occur such that frequency-locking with the carrier frequency of the reception signal results, causing the second wireless communication apparatus to transmit a communication enable signal to the first wireless communication apparatus.

12. A bidirectional wireless communication method comprising:
    causing a first wireless communication apparatus to multiplex a modulated signal obtained by modulating an input signal by a reference carrier signal having a predetermined carrier frequency, and to wirelessly transmit a resultant transmission signal;
    causing a first oscillator in a first wireless communication apparatus to produce the reference carrier signal having a frequency upon which transmission processing is based;
    varying the frequency of the first oscillator;
    causing a second wireless communication apparatus to receive the transmission signal wirelessly transmitted by the first wireless communication apparatus and produce therefrom a reception signal;
    causing a second oscillator in the second wireless communication apparatus to produce a signal having a free-running oscillation frequency upon which reception processing is based;
    injecting the reception signal into the second oscillator;
    detecting whether the free-running oscillation frequency of the signal of the second oscillator is in a frequency range in which injection locking with the carrier frequency of the reception signal will occur such that frequency-locking with the carrier frequency of the reception signal results; and
    when the free-running oscillation frequency of the signal of the second oscillator is in a frequency range in which injection locking with the carrier frequency of the reception signal will occur such that frequency-locking with the carrier frequency of the reception signal results, causing the second wireless communication apparatus to transmit a communication enable signal to the first wireless communication apparatus.

13. A bidirectional wireless communication system comprising:
    a first wireless communication apparatus configured to multiplex a modulated signal obtained by modulating an input signal by a reference carrier signal having a predetermined carrier frequency, and wirelessly transmit a resultant transmission signal; and
    a second wireless communication apparatus, including:
    reception means for receiving the transmission signal wirelessly transmitted by the first wireless communication apparatus and producing therefrom a reception signal,
    first oscillation means for producing a signal having a free-running oscillation frequency upon which reception processing is based, where the reception signal is injected into the first oscillation means,
    control means for varying the free-running oscillation frequency of the first oscillation means, and
    frequency locking detection means for detecting whether the free-running oscillation frequency of the signal of the first oscillation means is in a frequency range in which injection locking with the carrier frequency of the reception signal will occur such that frequency-locking with the carrier frequency of the reception signal results;
    wherein, when the frequency locking detection means detects that the free-running oscillation frequency of the signal of the first oscillation means is in a frequency range in which injection locking with the carrier frequency of the reception signal will occur such that frequency-locking with the carrier frequency of the reception signal results, the second wireless communication apparatus transmits a communication enable signal to the first wireless communication apparatus.

14. A bidirectional wireless communication system comprising:
    a first wireless communication apparatus configured to multiplex a modulated signal obtained by modulating an input signal by a reference carrier signal having a predetermined carrier frequency, and wirelessly transmit a resultant transmission signal, the first wireless communication apparatus including:
    first oscillation means for producing a reference carrier signal having a frequency upon which transmission processing is based, and
    control means for varying the frequency of the first oscillation means; and
    a second wireless communication apparatus, including:
    reception means for receiving the transmission signal wirelessly transmitted by the first wireless communication apparatus and producing therefrom a reception signal,
    second oscillation means for producing a signal having a free-running oscillation frequency upon which reception processing is based, where the reception signal is injected into the second oscillation means, and
    frequency locking detection means for detecting whether the free-running oscillation frequency of the signal of the second oscillation means is in a frequency range in which injection locking with the carrier frequency of the reception signal will occur such that frequency-locking with the carrier frequency of the reception signal results;
    wherein, when the frequency locking detection means detects that the free-running oscillation frequency of the signal of the second oscillation means is in a frequency range in which injection locking with the carrier frequency of the reception signal will occur such that frequency-locking with the carrier frequency of the reception signal results, the second wireless communication apparatus transmits a communication enable signal to the first wireless communication apparatus.

15. A wireless communication apparatus executing wireless communication with another wireless communication apparatus on the transmission side that multiplexes a modulated signal obtained by modulating an input signal by a reference carrier signal having a predetermined carrier frequency, transmits a resultant transmission signal, and receives at least a communication enable signal, comprising:
    reception means for receiving the transmission signal and producing therefrom a reception signal,
    first oscillation means for producing a signal having a free-running oscillation frequency upon which reception processing is based, where the reception signal is injected into the first oscillation means,
    control means for varying the free-running oscillation frequency of the first oscillation means, and
    frequency locking detection means for detecting whether the free-running oscillation frequency of the signal of the first oscillation means is in a frequency range in which injection locking with the carrier frequency of the reception signal will occur such that frequency-locking with the carrier frequency of the reception signal results;
    wherein, when the frequency locking detection means detects that the free-running oscillation frequency of the signal of the first oscillation means is in a frequency range in which injection locking with the carrier frequency of the reception signal will occur such that frequency-locking with the carrier frequency of the reception signal results, the wireless communication apparatus transmits a communication enable signal.

16. A wireless communication apparatus executing wireless communication with another wireless communication apparatus on the transmission side that transmits a transmission signal resulting from multiplexing a modulated signal obtained by modulating an input signal by a reference carrier signal having a predetermined carrier frequency while variably controlling the carrier frequency of said reference carrier signal and receives at least a communication enable signal, comprising:
    reception means for receiving the transmission signal and producing therefrom a reception signal;
    first oscillation means for producing a signal having a free-running oscillation frequency upon which reception processing is based, where the reception signal is injected into the first oscillation means; and
    frequency locking detection means for detecting whether the free-running oscillation frequency of the signal of the first oscillation means is in a frequency range in which injection locking with the carrier frequency of the reception signal will occur such that frequency-locking with the carrier frequency of the reception signal results;
    wherein, when the frequency locking detection means detects that the free-running oscillation frequency of the signal of the first oscillation means is in a frequency range in which injection locking with the carrier frequency of the reception signal will occur such that frequency-locking with the carrier frequency of the reception signal results, the wireless communication apparatus transmits a communication enable signal.

* * * * *